(12) United States Patent
Buchberger, Jr. et al.

(10) Patent No.: US 7,479,456 B2
(45) Date of Patent: Jan. 20, 2009

(54) GASLESS HIGH VOLTAGE HIGH CONTACT FORCE WAFER CONTACT-COOLING ELECTROSTATIC CHUCK

(75) Inventors: Douglas A. Buchberger, Jr., Livermore, CA (US); Daniel J. Hoffman, Saratoga, CA (US); Kartik Ramaswamy, Santa Clara, CA (US); Andrew Nguyen, San Jose, CA (US); Hiorji Hanawa, Sunnyvale, CA (US); Kenneth S. Collins, San Jose, CA (US); Amir Al-Bayati, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 316 days.

(21) Appl. No.: 10/929,104

(22) Filed: Aug. 26, 2004

(65) Prior Publication Data

US 2006/0043065 A1 Mar. 2, 2006

(51) Int. Cl.
*H01L 21/461* (2006.01)
*H01L 21/302* (2006.01)

(52) U.S. Cl. .............. 438/706; 438/707; 438/708; 438/709; 438/710; 438/714; 438/715

(58) Field of Classification Search .............. None
See application file for complete search history.

(56) References Cited

U.S. PATENT DOCUMENTS

| | | | |
|---|---|---|---|
| 2,344,138 A | 3/1944 | Drummond | 117/107 |
| 3,109,100 A | 10/1963 | Gecewicz | 250/219 |
| 3,385,356 A | 5/1968 | Dalin | 165/146 |
| 3,576,685 A | 4/1971 | Swann et al. | 148/187 |
| 3,907,616 A | 9/1975 | Wiemer | 148/188 |
| 4,116,791 A | 9/1978 | Zega | 204/192 |
| 4,184,188 A | 1/1980 | Briglia | 361/234 |
| 4,382,099 A | 5/1983 | Legge et al. | 427/34 |
| 4,384,918 A | 5/1983 | Abe | 156/643 |
| 4,385,946 A | 5/1983 | Finegan et al. | 148/175 |

(Continued)

FOREIGN PATENT DOCUMENTS

EP 0 546 852 A1 6/1993

(Continued)

OTHER PUBLICATIONS

Hu, C.-K., et al., "A process for improved Al(cu) reactive ion etching", Journal of Vacuum Science and Technology, May 1, 1989, pp. 682-685, vol. 7, No. 3, American Institute of Physics, New York, U.S.

(Continued)

*Primary Examiner*—Duy-Vu N Deo
(74) *Attorney, Agent, or Firm*—Law Office of Robert M. Wallace

(57) ABSTRACT

A method of electrostatically chucking a wafer while removing heat from the wafer in a plasma reactor includes providing a polished generally continuous surface on a puck, placing the wafer on the polished surface of the puck and cooling the puck. A chucking voltage is applied to an electrode within the puck to electrostatically pull the wafer onto the surface of the puck with sufficient force to attain a selected heat transfer coefficient between contacting surfaces of the puck and wafer.

36 Claims, 15 Drawing Sheets

U.S. PATENT DOCUMENTS

| | | | |
|---|---|---|---|
| 4,434,036 A | 2/1984 | Hoerschelmann et al. | 204/164 |
| 4,465,529 A | 8/1984 | Arima et al. | 148/188 |
| 4,481,229 A | 11/1984 | Suzuki et al. | 427/38 |
| 4,500,563 A | 2/1985 | Ellenberger et al. | 427/38 |
| 4,521,441 A | 6/1985 | Flowers | 427/38 |
| 4,539,217 A | 9/1985 | Farley | 427/10 |
| 4,565,588 A | 1/1986 | Seki et al. | 148/186 |
| 4,584,026 A | 4/1986 | Wu et al. | 148/1.5 |
| 4,638,858 A | 1/1987 | Chu | 165/185 |
| 4,692,836 A | 9/1987 | Suzuki | 361/234 |
| 4,698,104 A | 10/1987 | Barker et al. | 437/141 |
| 4,764,394 A | 8/1988 | Conrad | 427/38 |
| 4,771,730 A | 9/1988 | Tezuka | 118/723 |
| 4,778,561 A | 10/1988 | Ghanbari | 156/643 |
| 4,867,859 A | 9/1989 | Harada et al. | 304/298 |
| 4,871,421 A | 10/1989 | Ogle et al. | 156/643 |
| 4,892,753 A | 1/1990 | Weng et al. | 427/38 |
| 4,912,065 A | 3/1990 | Mizuno et al. | 437/141 |
| 4,937,205 A | 6/1990 | Nakayama et al. | 437/165 |
| 4,948,458 A | 8/1990 | Ogle | 156/643 |
| 5,040,046 A | 8/1991 | Chhabra et al. | 357/54 |
| 5,061,838 A | 10/1991 | Lane et al. | 219/121.59 |
| 5,074,456 A | 12/1991 | Degner et al. | 228/121 |
| 5,106,827 A | 4/1992 | Borden et al. | 505/1 |
| 5,107,201 A | 4/1992 | Ogle | 324/72.5 |
| 5,250,137 A | 10/1993 | Arami et al. | 156/345 |
| 5,270,250 A | 12/1993 | Murai et al. | 437/165 |
| 5,277,751 A | 1/1994 | Ogle | 156/643 |
| 5,288,650 A | 2/1994 | Sandow | 437/24 |
| 5,290,382 A | 3/1994 | Zarowin et al. | 156/345 |
| 5,312,778 A | 5/1994 | Collins et al. | 437/225 |
| 5,345,999 A | 9/1994 | Hosokawa | 165/80.2 |
| 5,354,381 A | 10/1994 | Sheng | 118/723 |
| 5,423,945 A | 6/1995 | Marks et al. | 156/662.1 |
| 5,435,881 A | 7/1995 | Ogle | 156/345 |
| 5,463,525 A | 10/1995 | Barnes et al. | 361/234 |
| 5,467,249 A | 11/1995 | Barnes et al. | 361/234 |
| 5,505,780 A | 4/1996 | Dalvie et al. | 118/723 |
| 5,510,011 A | 4/1996 | Okamura et al. | 204/192.3 |
| 5,514,603 A | 5/1996 | Sato | 437/16 |
| 5,515,167 A | 5/1996 | Ledger et al. | 356/357 |
| 5,520,209 A | 5/1996 | Goins et al. | 137/246 |
| 5,542,559 A | 8/1996 | Kawakami et al. | 216/67 |
| 5,561,072 A | 10/1996 | Saito | 437/24 |
| 5,569,363 A | 10/1996 | Bayer et al. | 204/192.32 |
| 5,572,038 A | 11/1996 | Sheng et al. | 250/492.21 |
| 5,581,874 A | 12/1996 | Aoki et al. | 29/825 |
| 5,587,038 A | 12/1996 | Cecchi et al. | 156/345 |
| 5,627,435 A | 5/1997 | Jansen et al. | 315/111.21 |
| 5,643,838 A | 7/1997 | Dean et al. | 437/238 |
| 5,648,701 A | 7/1997 | Hooke et al. | 315/111.21 |
| 5,653,811 A | 8/1997 | Chan | 118/723 |
| 5,654,043 A | 8/1997 | Shao et al. | 427/527 |
| 5,660,895 A | 8/1997 | Lee et al. | 427/579 |
| 5,665,640 A | 9/1997 | Foster et al. | 438/680 |
| 5,674,321 A | 10/1997 | Pu et al. | 118/723 |
| 5,683,517 A | 11/1997 | Shan | 118/723 |
| 5,711,812 A | 1/1998 | Chapek et al. | 118/723 |
| 5,718,798 A | 2/1998 | Deregibus | 156/429 |
| 5,764,471 A | 6/1998 | Burkhart | 361/234 |
| 5,770,982 A | 6/1998 | Moore | 333/32 |
| 5,880,923 A | 3/1999 | Hausmann | 361/234 |
| 5,883,778 A | 3/1999 | Sherstinsky et al. | 361/234 |
| 5,888,413 A | 3/1999 | Okumura et al. | 216/68 |
| 5,897,752 A | 4/1999 | Hong et al. | 204/192.12 |
| 5,911,832 A | 6/1999 | Denholm et al. | 118/723 |
| 5,923,521 A | 7/1999 | Burkhart | 361/234 |
| 5,935,077 A | 8/1999 | Ogle | 600/504 |
| 5,944,942 A | 8/1999 | Ogle | 156/345 |
| 5,948,168 A | 9/1999 | Shan et al. | 118/723 |
| 5,985,742 A | 11/1999 | Henley et al. | 438/515 |
| 5,994,207 A | 11/1999 | Henley et al. | 438/515 |
| 5,994,236 A | 11/1999 | Ogle | 438/728 |
| 5,998,933 A | 12/1999 | Shun'Ko | 315/11.51 |
| 6,000,360 A | 12/1999 | Koshimuzu | 118/723 |
| 6,013,567 A | 1/2000 | Henley et al. | 438/515 |
| 6,020,592 A | 2/2000 | Liebert et al. | 250/492.21 |
| 6,022,418 A * | 2/2000 | Iwabuchi | 118/728 |
| 6,028,762 A | 2/2000 | Kamitani | 361/234 |
| 6,033,482 A | 3/2000 | Parkhe | 118/728 |
| 6,041,735 A | 3/2000 | Murzin et al. | 118/723 |
| 6,050,218 A | 4/2000 | Chen et al. | 118/723 |
| 6,072,685 A | 6/2000 | Herchen | 361/234 |
| 6,076,483 A | 6/2000 | Shintani et al. | 118/723 |
| 6,081,414 A | 6/2000 | Flanigan et al. | 361/234 |
| 6,096,661 A | 8/2000 | Ngo et al. | 438/788 |
| 6,101,971 A | 8/2000 | Denholm et al. | 118/723 E |
| 6,103,599 A | 8/2000 | Henley et al. | 438/459 |
| 6,132,552 A | 10/2000 | Donohoe et al. | 156/345 |
| 6,139,697 A | 10/2000 | Chen et al. | 204/192.15 |
| 6,150,628 A | 11/2000 | Smith et al. | 219/121.54 |
| 6,151,203 A | 11/2000 | Shamouilian et al. | 361/234 |
| 6,153,524 A | 11/2000 | Henley et al. | 438/691 |
| 6,155,090 A | 12/2000 | Rubenson | 70/367 |
| 6,164,241 A | 12/2000 | Chen et al. | 118/723 |
| 6,165,376 A | 12/2000 | Miyake et al. | 216/67 |
| 6,174,450 B1 | 1/2001 | Patrick et al. | 216/61 |
| 6,174,743 B1 | 1/2001 | Pangrle et al. | 438/14 |
| 6,182,604 B1 | 2/2001 | Goeckner et al. | 118/723 |
| 6,187,110 B1 | 2/2001 | Henley et al. | 148/33.2 |
| 6,188,564 B1 | 2/2001 | Hao | 361/234 |
| 6,207,005 B1 | 3/2001 | Henley et al. | 156/345 |
| 6,237,527 B1 | 5/2001 | Kellerman et al. | 118/723 |
| 6,239,553 B1 | 5/2001 | Barnes et al. | 315/111.51 |
| 6,246,567 B1 | 6/2001 | Parkhe | 361/234 |
| 6,248,642 B1 | 6/2001 | Donlan et al. | 438/407 |
| 6,265,328 B1 | 7/2001 | Henley et al. | 438/782 |
| 6,291,313 B1 | 9/2001 | Henley et al. | 438/458 |
| 6,291,939 B1 | 9/2001 | Dolan et al. | 438/407 |
| 6,300,643 B1 | 10/2001 | Fang et al. | 250/492.21 |
| 6,303,519 B1 | 10/2001 | Hsiao et al. | 438/758 |
| 6,305,316 B1 | 10/2001 | DiVergilio et al. | 118/723 |
| 6,335,536 B1 | 1/2002 | Goeckner et al. | 250/492.3 |
| 6,339,297 B1 | 1/2002 | Sugai et al. | 315/111.21 |
| 6,341,574 B1 | 1/2002 | Bailey, III et al. | 118/723 |
| 6,348,126 B1 | 2/2002 | Hanwa et al. | 156/345 |
| 6,350,697 B1 | 2/2002 | Richardson et al. | 438/710 |
| RE37,580 E | 3/2002 | Barnes et al. | 361/234 |
| 6,392,351 B1 | 5/2002 | Shun'Ko | 315/111.51 |
| 6,395,150 B1 | 5/2002 | Van Cleemput et al. | 204/192.37 |
| 6,403,453 B1 | 6/2002 | Ono et al. | 438/513 |
| 6,410,449 B1 | 6/2002 | Hanawa et al. | 438/706 |
| 6,413,321 B1 | 7/2002 | Kim et al. | 118/725 |
| 6,417,078 B1 | 7/2002 | Dolan et al. | 438/480 |
| 6,418,874 B1 | 7/2002 | Cox et al. | 118/723 |
| 6,426,015 B1 | 7/2002 | Xia et al. | 216/62 |
| 6,433,553 B1 | 8/2002 | Goeckner et al. | 324/464 |
| 6,453,842 B1 | 9/2002 | Hanawa et al. | 118/723 |
| 6,461,972 B1 | 10/2002 | Kabansky | 438/710 |
| 6,468,388 B1 | 10/2002 | Hanawa et al. | 156/345.48 |
| 6,494,986 B1 | 12/2002 | Hanawa et al. | 156/345.35 |
| 6,500,686 B2 | 12/2002 | Katata et al. | 438/22 |
| 6,511,899 B1 | 1/2003 | Henley et al. | 438/515 |
| 6,513,538 B2 | 2/2003 | Chung et al. | 134/1.2 |
| 6,514,838 B2 | 2/2003 | Chan | 438/513 |
| 6,528,391 B1 | 3/2003 | Henley et al. | 438/459 |
| 6,535,371 B1 * | 3/2003 | Kayamoto et al. | 361/234 |
| 6,551,446 B1 | 4/2003 | Hanawa et al. | 156/345.48 |
| 6,559,408 B2 | 5/2003 | Smith et al. | 219/121.57 |
| 6,579,805 B1 | 6/2003 | Bar-Gadda | 438/710 |
| 6,582,999 B2 | 6/2003 | Henley et al. | 438/221 |
| 6,593,173 B1 | 7/2003 | Anc et al. | 438/149 |
| 6,679,981 B1 | 1/2004 | Pan et al. | 204/298.06 |
| 6,687,113 B2 | 2/2004 | Saito et al. | 361/234 |

| | | | |
|---|---|---|---|
| 6,800,559 B2 | 10/2004 | Bar-Gadda | 438/710 |
| 6,811,448 B1 | 11/2004 | Paton et al. | 439/706 |
| 6,838,695 B2 | 1/2005 | Doris et al. | 257/55 |
| 2001/0042827 A1 | 11/2001 | Fang et al. | |
| 2002/0047543 A1 | 4/2002 | Sugai et al. | 315/111.21 |
| 2002/0088776 A1 | 7/2002 | Nakano et al. | 219/121.43 |
| 2003/0013260 A1 | 1/2003 | Gossman et al. | 438/301 |
| 2003/0013314 A1 | 1/2003 | Ying et al. | 438/710 |
| 2003/0047283 A1* | 3/2003 | Parkhe et al. | 156/345.51 |
| 2003/0085205 A1 | 5/2003 | Lai et al. | 219/121.43 |
| 2004/0045813 A1* | 3/2004 | Kanno et al. | 204/242 |
| 2005/0183669 A1* | 8/2005 | Parkhe et al. | 118/724 |

FOREIGN PATENT DOCUMENTS

| | | |
|---|---|---|
| EP | 0 836 218 A2 | 4/1998 |
| EP | 0 964 074 A2 | 12/1999 |
| EP | 1 111 084 A1 | 6/2001 |
| EP | 1 158 071 A2 | 11/2001 |
| EP | 1 191 121 A1 | 3/2002 |
| JP | 59-86214 | 5/1984 |
| JP | 59-218728 | 12/1984 |
| JP | 62-120041 | 6/1987 |
| JP | 070455542 | 2/1995 |
| JP | 2000150908 | 5/2000 |
| WO | WO 99/00832 | 1/1999 |
| WO | WO 00/30149 | 5/2000 |
| WO | WO 01/11650 A1 | 2/2001 |
| WO | WO 02/25694 A2 | 3/2002 |
| WO | WO 93/18201 | 9/2003 |

OTHER PUBLICATIONS

Wolf, Stanley and Taubner, Richard, "Silicon Processing for the VLSI Era", 2000, Lattice Press, vol. 1, pp. 303-308.

Van de Ven, Evert P., Connick, I-Wen, and Harrus, Alain S., "Advantages of Dual Frequency PECVD For Deposition of ILD and Passivation Films", *IEEE*, Proceedings of VMIC Conference, Jun. 12-13, 1990, pp. 194-201.

Zhnag, B.C., and Cross, R.C., "A high power radio frequency transformer for plasma production," *Rev. Sci. Instrum.*, vol. 69, No. 1, pp. 101-108, Jan. 1998.

U.S. Appl. No. 09/638,075, filed Aug. 11, 2000, entitled, "Externally Excited Torroidal Plasma Source," By Hanwa, et al.

* cited by examiner

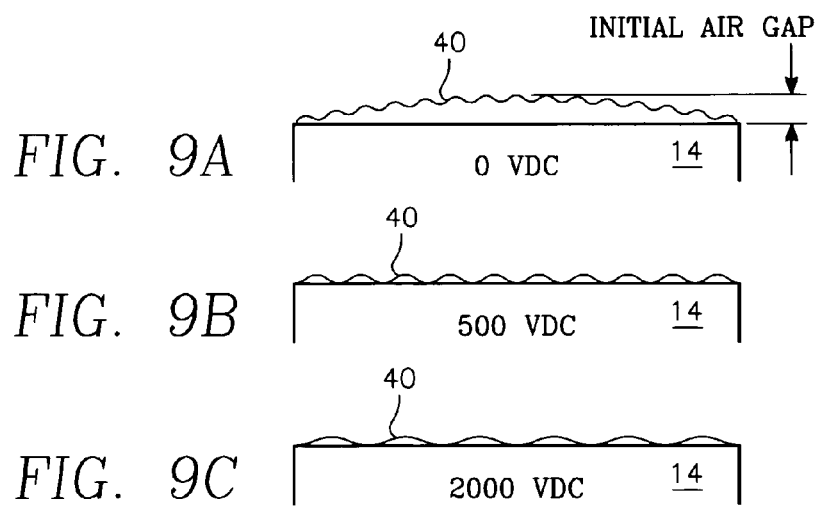
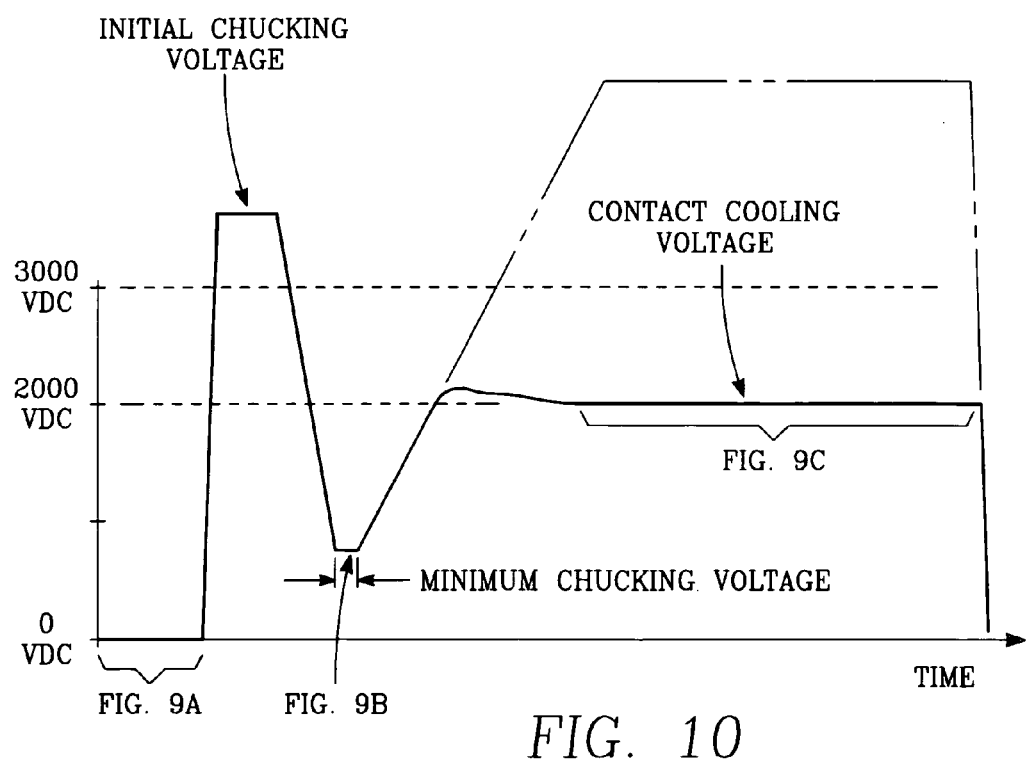

GASLESS HIGH VOLTAGE HIGH CONTACT FORCE WAFER CONTACT-COOLING ELECTROSTATIC CHUCK

CROSS-REFRFENCE TO RELATED APPLICATIONS

This application contains subject matter related to U.S. application Ser. No. 10/218,179, filed Aug. 12, 2002, entitled LOW LOSS RE BIAS ELECTRODE FOR A PLASMA REACTOR WITH ENHANCED WAFER EDGE RF COUPLING AND HIGHLY EFFICIENT WAFER COOLING, by Hiroji Hanawa et al.; U.S. application Ser. No. 10/646,458, filed Aug. 22, 2003, entitled PLASMA IMMERSION ION IMPLANTATION APPARATUS INCLUDING A PLASMA SOURCE HAVING LOW DISSOCIATION AND LOW MINIMUM PLASMA VOLTAGE, by Kenneth Collins et al.; U.S. application Ser. No. 10/646,533, filed Aug. 22, 2003, entitled PLASMA IMMERSION ION IMPLANTATION PROCESS USING A PLASMA SOURCE HAVING LOW DISSOCIATION AND MINIMUM PLASMA VOLTAGE, by Kenneth Collins et al.; U.S. application Ser. No. 10/646,532, filed Aug. 22, 2003, entitled PLASMA IMMERSION ION IMPLANTATION APPARATUS INCLUDING A CAPACITIVELY COUPLED RF PLASMA SOURCE HAVING LOW DISSOCIATION AND LOW MINIMUM PLASMA VOLTAGE, by Kenneth Collins et al.; U.S. application Ser. No. 10/646,612, filed Aug. 22, 2003, entitled PLASMA IMMERSION ION IMPLANTATION PROCESS USING A CAPACITIVELY COUPLED PLASMA SOURCE HAVING LOW DISSOCIATION AND LOW MINIMUM PLASMA VOLTAGE, by Kenneth Collins et al.; U.S. application Ser. No. 10/646,528, filed Aug. 22, 2003, entitled PLASMA IMMERSION ION IMPLANTATION PROCESS USING A PLASMA SOURCE HAVING LOW DISSOCIATION AND LOW MINIMUM PLASMA VOLTAGE, by Kenneth Collins et al.; U.S. application Ser. No. 10/646,467, filed Aug. 22, 2003, entitled PLASMA IMMERSION ION IMPLANTATION PROCESS USING AN INDUCTIVELY COUPLED PLASMA SOURCE HAVING LOW DISSOCIATION AND LOW MINIMUM PLASMA VOLTAGE, by Kenneth Collins et al.; U.S. application Ser. No. 10/646,527, filed Aug. 22, 2003, entitled PLASMA IMMERSION ION IMPLANTATION SYSTEM INCLUDING A PLASMA SOURCE HAVING LOW DISSOCIATION AND LOW MINIMUM PLASMA VOLTAGE, by Kenneth Collins et al.; U.S. application Ser. No. 10/646,526, filed Aug. 22, 2003, entitled PLASMA IMMERSION ION IMPLANTATION SYSTEM INCLUDING AN CAPACITIVELY COUPLED PLASMA SOURCE HAVING LOW DISSOCIATION AND LOW MINIMUM PLASMA VOLTAGE, by Kenneth Collins et al.; and U.S. application Ser. No. 10/646,460, filed Aug. 22, 2003, entitled PLASMA IMMERSION ION IMPLANTATION SYSTEM INCLUDING AN INDUCTIVELY COUPLED PLASMA SOURCE HAVING LOW DISSOCIATION AND LOW MINIMUM PLASMA VOLTAGE, by Kenneth Collins et al., all of which are assigned to the present assignee.

BACKGROUND OF THE INVENTION

Semiconductor wafer processing requires more strict control of wafer temperature to reduce wafer temperature excursion during processing, as device geometries shrink to ever smaller dimensions. For example, high temperatures can adversely affect the sharp semiconductor junction profiles required for small feature sizes. Limiting workpiece (or semiconductor wafer) temperature during processing is also necessary whenever processing is carried out using photoresist masking of device features, in order to avoid heat-induced degradation of the photoresist.

In plasma processing of wafers, the wafer temperature can exceed many hundreds of degrees C., particularly where large RF bias power levels are employed at low chamber pressure, where heat transfer by gas convection and conduction is poor (and radiation heat transfer is also poor). For example, in plasma immersion ion implantation reactors, RF bias power applied to the wafer may be many kWatts, particularly where deep implant depths are required. The wafer must be actively cooled to limit temperature rise to maintain photoresist integrity or avoid material degradation. Typically electrostatic chucks are used to clamp the wafer to a cooled or temperature controlled surface. In a conventional Unipolar or Monopolar electrostatic chuck, a voltage is applied across a dielectric layer between wafer and electrode. The "dielectric" layer may be a near ideal insulator or may be a semiconductor. The "dielectric" layer may be a deposited film or a bulk solid material, such as ceramic or semiconducting material. The electrostatic field across the structure formed by the wafer, dielectric layer, air or vacuum gap and the electrode produces an attractive force between the wafer and the dielectric layer. Alternatively, conventional Bipolar electrostatic chucks have more than one electrode. A voltage is applied across two or more electrodes separated from the wafer by the dielectric layer. The electrostatic fields across the structure formed by the wafer, dielectric layer, air or vacuum gap and each electrode produces an attractive force between wafer and dielectric layer.

Typical electrostatic chucks employ a heat transfer gas between the wafer and the electrostatic chuck surface to promote heat transfer. Helium is a preferred gas due to its high thermal conductivity, but other gases are sometimes used. For high RF power levels (high heat load on the wafer), the helium pressure must be correspondingly high to provide a sufficient heat transfer rate. Unfortunately, such high gas pressure reduces the threshold RF power level (or RF voltage level) at which arcing, gas breakdown, or dielectric breakdown occurs within the helium gas passages in the chuck, in the interface between electrostatic chuck and wafer, or in the wafer support pedestal. Such problems have become more critical as greater demands are placed on processes such as plasma immersion ion implantation processes. For example, certain implantation processes may require implant doses in excess of $10^{17}$ $cm^{-3}$, requiring the exposure of the wafer to high RF power levels for several minutes, during which the wafer temperature can reach over 400° C. without active cooling or over 200° C. with conventional electrostatic chucks. Similar problems can occur in other applications, such as plasma or reactive ion etching etching, plasma chemical vapor deposition, physical vapor deposition, etc.

Another problem is that the top surface of the electrostatic chuck must have many open channels (channels machined into the chuck top surface) through which the helium cooling gas is pumped to provide thermal conductance between the wafer and the chuck. Such channels have many sharp edges, which create contamination of particles on the wafer backside or contamination of the process. These edges may have radii on the order of microns, so as to be very sharp. Contamination is caused by scratching the wafer backside over the sharp edges of the channels and/or by the deleterious effects of high electric fields in the vicinity of each sharp edge, which can lead to arcing about the sharp edges, removing material from the chuck surface into the plasma. A goal of wafer processing in fabricating extremely small features on the wafer is to limit the number of contaminant particles on each wafer backside to not more than tens of thousands or less. The contaminants either contaminate the current wafer or are passed along to contaminate other processes or reactors that handle the same lot of wafers.

The use of high pressure gas to cool the wafer makes the electrostatic chuck so vulnerable to arcing, gas breakdown or dielectric breakdown, that the applied RF bias voltage cannot exceed several kV in typical cases. Moreover, the ability of a conventional electrostatic chuck to cool the wafer is inadequate for many of the future processes being contemplated, its heat transfer coefficient for the wafer being less than about 1000 Watts/m$^{2\circ}$ K. What is needed is an electrostatic chuck (wafer support pedestal) which can withstand about 10 kV of RF bias voltage without arcing, gas breakdown, or dielectric breakdown, which has a heat transfer coefficient of at least 1000 Watts/m$^{2\circ}$ K (between wafer and electrostatic chuck) and has a heat transfer coefficient of at least 5000 Watts/m$^{2\circ}$ K (between electrostatic chuck dielectric surface and heat sink or cooling circuit), minimizes scratching and particle formation at wafer backside, does not contaminate the wafer backside, and has material properties compatible with the plasma processing environment (consumption rate, non-source of contaminants).

SUMMARY OF THE INVENTION

A method of electrostatically chucking a workpiece such as a semiconductor wafer, while controlling workpiece temperature during plasma processing requiring application of a high level of RF power, includes providing a polished surface on a puck in the reactor, placing the workpiece on the polished surface of the puck and cooling the puck. Plasma processing is carried out by either coupling RF plasma bias power through the puck or applying RF plasma source power to plasma in the reactor. Furthermore, during plasma processing, a chucking voltage is applied to a chucking electrode of the puck to pull the workpiece into direct contact with the surface of the puck with sufficient electrostatic force to remove heat from the workpiece through directly contacting surfaces of the puck and workpiece at about the rate at which the workpiece is heated either directly by the RF plasma bias power or indirectly through the plasma from the RF plasma source power. The chucking voltage is sufficient to remove heat at the rate at which heat is deposited in the workpiece, or to maintain the workpiece temperature below a certain temperature or to limit the rate of rise of the workpiece temperature.

Alternatively, the chucking voltage is selected to provide a sufficient force to attain a selected heat transfer coefficient between contacting surfaces of the puck and wafer such that the wafer temperature or the rate of temperature rise is controlled. The chucking voltage is typically specified relative to the DC bias on the wafer (the time average voltage on the wafer with respect to the plasma ground reference, typically the chamber wall). The chucking voltage may be a positive or negative voltage with respect to the DC bias on the wafer. The chucking voltage may be adjusted during processing to accommodate varying heat load, RF bias voltage or target wafer temperature.

The foregoing eliminates the need for any coolant gas in the electrostatic chuck, so that far more RF bias voltage may be applied through the chuck without arcing, gas breakdown or dielectric breakdown. Moreover, the contact cooling of the wafer provides superior cooling. And, the polished surface of the puck reduces contamination.

BRIEF DESCRIPTION OF THE DRAWINGS

FIGS. 9A, 9B and 9C illustrate the wafer curvature for different magnitudes of the chucking voltage.

FIG. 10 illustrates the chucking voltage over time corresponding to the sequence of FIGS. 9A through 9C.

DETAILED DESCRIPTION OF THE INVENTION

Figure 1:
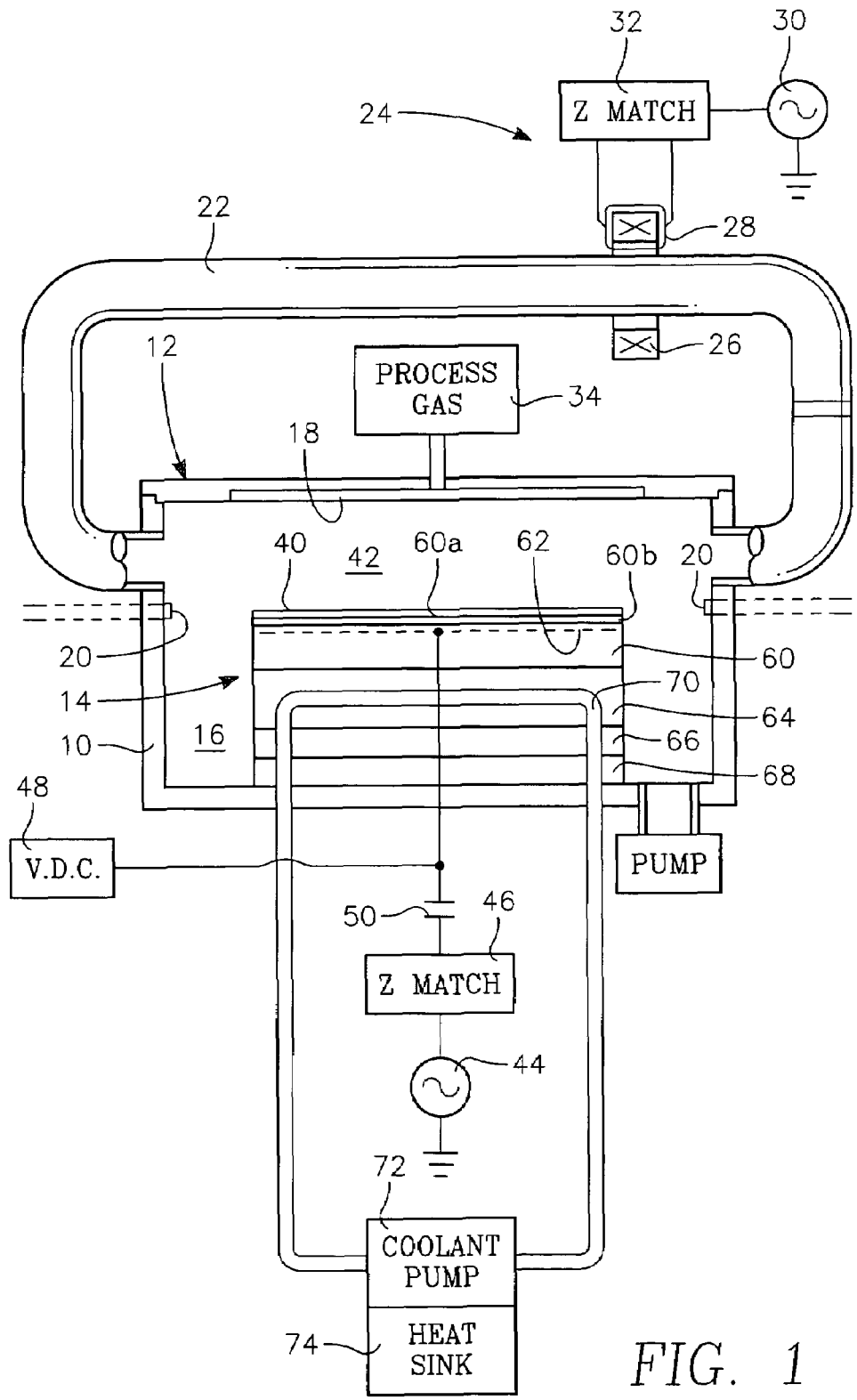
FIG. 1 is a cut-away side view of a plasma reactor for processing a semiconductor reactor that includes the wafer contact-cooling electrostatic chuck.
Figure 2:
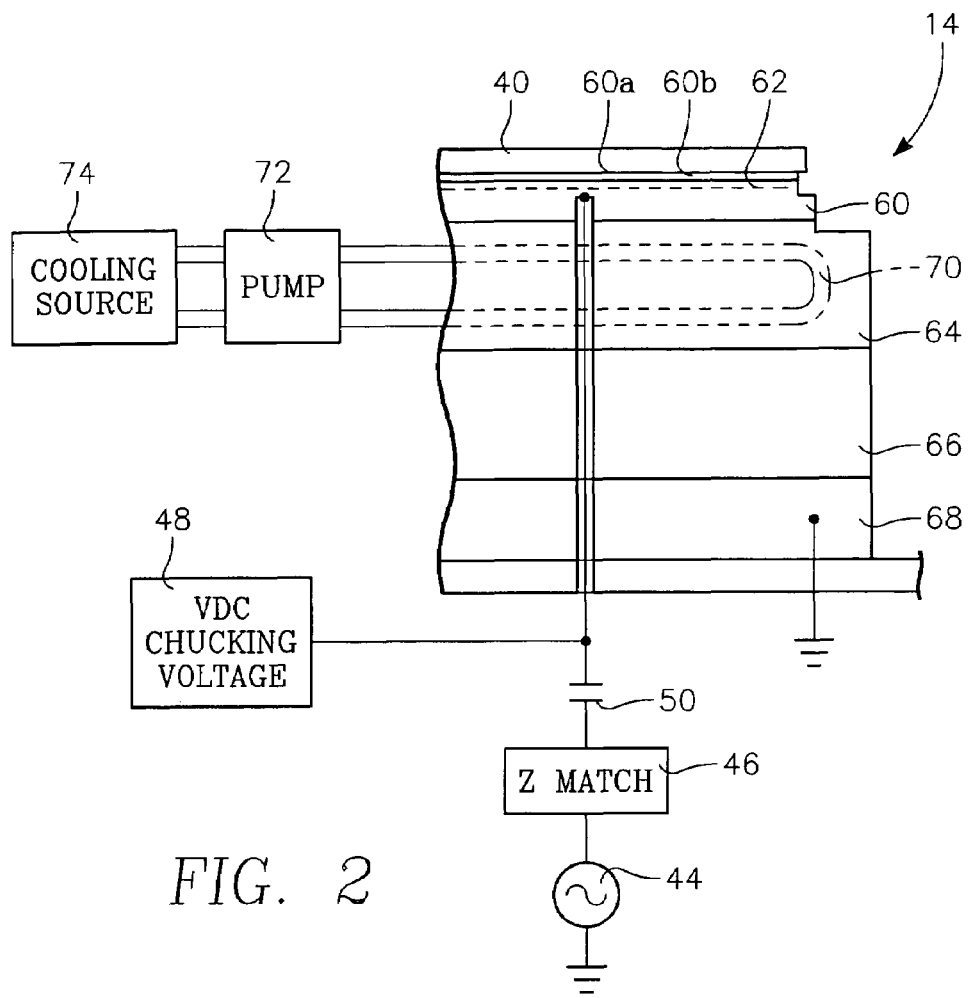
FIG. 2 is a cross-sectional side view of the wafer contact-cooling electrostatic chuck.
Figure 3:
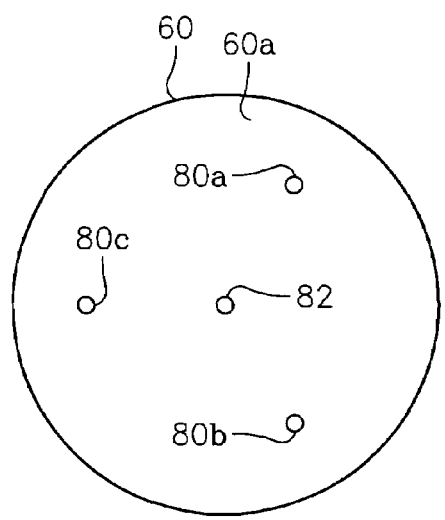
FIGS. 3 and 4 are top cross-sectional views of different layers of the wafer contact-cooling electrostatic chuck.
Figure 4:
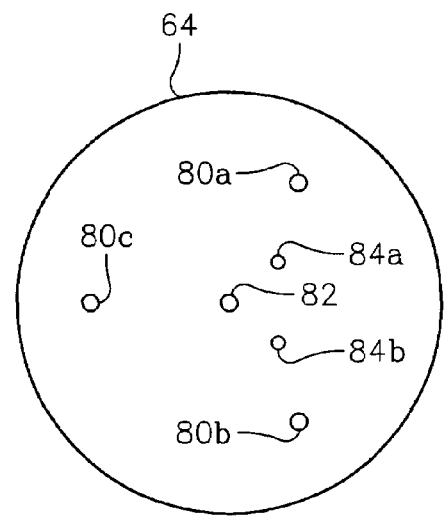

FIGS. 1 through 4 depict a plasma reactor with the wafer contact-cooling electrostatic chuck in accordance with certain embodiments of the invention. FIG. 1 is a cut-away side view of a plasma reactor for processing a semiconductor reactor that includes the wafer contact-cooling electrostatic chuck. FIG. 2 is a cross-sectional side view of the wafer contact-cooling electrostatic chuck. FIGS. 3 and 4 are top cross-sectional views of different layers of the wafer contact-cooling electrostatic chuck. In FIG. 1, the plasma reactor has a cylindrical side wall 10, a ceiling 12 and a wafer contact-cooling electrostatic chuck 14. A pumping annulus 16 is defined between the chuck 14 and the sidewall 10. While the wafer contact-cooling electrostatic chuck 14 may be used in any type of plasma reactor or other reactor (such as thermal process reactor), the reactor in the example of FIG. 1 is of the type in which process gases can be introduced through a gas distribution plate 18 (or "showerhead") forming a large portion of the ceiling 12. Alternatively, the reactor could have gas distribution inlets 20 (dashed lines) that are separate from the ceiling 12. While the wafer contact-cooling electrostatic chuck 14 may be employed in conjunction with any plasma source (such as an inductively coupled RF plasma source, a capacitively coupled RF plasma source or a microwave plasma source), the reactor in the example of FIG. 1 has a reentrant RF torroidal plasma source consisting of an external reentrant tube 22 coupled to the interior of the reactor through opposite sides of the sidewall 10 (or, through openings in the ceiling 12 not shown in FIG. 1). An insulating ring 23 provides a D.C. break along the reentrant tube 22. The torroidal plasma source further includes an RF power applicator 24 that may include a magnetically permeable torroidal core 26 surrounding an annular portion of the reentrant tube 22, a conductive coil 28 wound around a portion of the core 26 and an RF plasma source power generator 30 coupled to the conductive coil through an optional impedance match circuit 32. A process gas supply 34 is coupled to the gas distribution plate 18 (or to the gas injectors 20). A semiconductor wafer or workpiece 40 is placed on top of the chuck 14. A processing region 42 is defined between the wafer 40 and the ceiling 12 (including the gas distribution plate 18). A torroidal plasma current oscillates at the frequency of the RF plasma source power generator 30 along a closed torroidal path extending through the reentrant tube 22 and the processing region 42.

RF bias power is applied to the chuck 14 by an RF bias power generator 44 through an impedance match circuit 46. A D.C. chucking voltage is applied to the chuck 14 from a chucking voltage source 48 isolated from the RF bias power generator 44 by an isolation capacitor 50. The RF power delivered to the wafer 40 from the RF bias power generator 44 can heat the wafer 40 to temperatures beyond 400 degrees C., depending upon the level and duration of the applied RF plasma bias power from the generator 44. It is believed that about 80% or more of the RF power from the bias power generator 44 is dissipated as heat in the wafer 40.

In other implementations, there may be little or no bias delivered by the bias power generator 44 (or there may be no bias power generator), in which case the wafer 40 is heated (indirectly) by power from the source power generator 30 via interaction between the wafer 40 and the plasma in the chamber. This interaction can include bombardment of the wafer by plasma ions, electrons and neutrals, with wafer heating arising from the kinetic energy of the ions, electrons and neutrals, as well as electrical effects arising from the interaction of the charged particles with electric fields in the vicinity of the wafer, as is well-known in the art. The wafer may be heated by radiation emitted by plasma species, such as ultraviolet, visible or infrared radiation emitted by excited atomic or molecular species (ions or neutrals) during relaxation, as is well known in the art. The wafer may be heated by other means, such as by hot surfaces in or adjacent the process chamber, by thermal radiation, convection or conduction, as is well known in the art. Thus, the wafer 40 is heated directly by RF power from the bias power generator 44 or indirectly (via wafer-plasma interaction) by RF power from the source power generator 30.

Conventionally, the wafer temperature was regulated to avoid overheating by providing coolant gas at a selected pressure between the wafer 40 and the chuck 14 and removing heat from the gas. Such gas introduction requires open gas channels in the chuck surface on which the wafer is mounted. The presence of such open coolant gas channels in the chuck surface creates two problems. First, the RF bias power applied to the chuck can cause the gas to break down in the channels. This problem is solved by either limiting the coolant gas pressure (which reduces the heat transfer from the wafer) or by limiting the RF bias voltage, e.g., to below 1 kV (which can negatively impact plasma processing). A second problem is that the many sharp edges defining the open gas channels in the chuck surface lead to contamination, either by the breaking off of material forming the sharp edges or by arcing near those edges, or by scratching of the wafer backside. A related problem is that in applications requiring very high RF bias power levels, the coolant gas breaks down (preventing operation) and the coolant gas system may have an insufficient heat transfer coefficient for the high heat load on the wafer.

The electrostatic chuck 14 of FIG. 2 is a wafer contact-cooling electrostatic chuck in which the portion of the chuck contacting the wafer is cooled. The wafer contact-cooling electrostatic chuck 14 requires no gas cooling source nor internal gas coolant passages to keep the wafer cool and remove heat from the wafer. Instead, the heat is removed from the wafer at a rate which limits the maximum wafer temperature or the time rate of rise of the wafer temperature during plasma processing, by cooling the chuck 14 itself while maintaining direct high-force contact between the wafer 40 and the chuck 14, as will now be described. Alternatively, the chucking voltage may be varied during wafer processing to vary the selected heat transfer coefficient in order to control wafer temperature to a target value. This latter feature may be carried out by monitoring the wafer temperature and varying the chuck voltage so as to minimize the difference between the measured wafer temperature and a target temperature. As the measured wafer temperature rises above a maximum target temperature, the chucking voltage is increased, and as the measured wafer temperature falls below a target minimum temperature, the chucking voltage may be decreased. Moreover, the high-force contact cooling of the wafer is able to control wafer temperature even at very high RF bias power levels.

Referring to FIG. 2, the chuck 14 has a top layer 60, referred to as a puck, consisting of insulative or semi-insulative material, such as aluminum nitride or aluminum oxide, which may be doped with other materials to control its electrical and thermal properties. A metal (molybdenum, for example) wire mesh or metal layer 62 inside of the puck 60 forms a cathode (or electrode) to which the chucking voltage is applied. The puck 60 may be formed as a ceramic. Or, it may be formed by plasma or physical deposition processes, or chemical vapor deposition process or plasma or flame spray coating or other method. It is supported on a metal layer 64, preferably consisting of a metal having a high thermal conductivity, such as aluminum. The metal layer 64 rests on a highly insulative layer 66 whose thickness, dielectric constant and dielectric loss tangent are chosen to provide the chuck 14 with selected RF characteristics (e.g., capacitance, loss resistance) compatible with the reactor design and process requirements. A metal base layer 68 is connected to ground. The wafer 40 is held on the chuck 14 by applying a D.C. voltage from the chucking voltage source 48 to the electrode 62. The application of voltage across the insulator layer 60 polarizes the insulator 60 and induces an opposite (attractive) image charge in the bottom surface of the wafer 40. In the case of a semi-insulator layer 60, in addition to inducing image charge in the bottom surface of the wafer, charge from the electrode 62 migrates through the semi-insulator layer 60 to accumulate very close to the top surface of the semi-insulator layer 60, for a minimum gap between the charge and the overlying wafer 40. (The term "semi-insulator" is discussed below.) This induces an opposite (attractive) image charge in the bottom surface of the wafer 40. The effective gap between the two opposing charge layers is so minimal as a result of the upward charge migration in the insulator layer 60 that the attractive force between the chuck and the wafer 40 is very large for a relatively small applied chucking voltage. For example, a chucking voltage of only 300 volts D.C. on the electrode 62 produces a chucking force across the wafer 40 equivalent to a pressure of about 100 Torr. The puck semi-insulator layer 60 therefore is formed of a material having a desired charge mobility, so that the material is not a perfect insulator (hence, the term "semi-insulator"). This semi-insulator material, although not a perfect insulator, may also not be a typical semiconductor, in some cases. In any case, the charge induced by the chucking voltage on the electrode 62 is mobile in the semi-insulator material of the puck layer 60, and therefore it may be said that the puck semi-insulator layer 60 is formed of a "charge mobile" material. One example of a material suitable for the puck semi-insulator or charge mobile layer 60 is aluminum nitride. Another example is aluminum oxide, which may optionally be doped to increase charge mobility. For example, the dopant material may be titanium dioxide.

RF bias power from the RF bias power generator 44 may be applied to the electrode 62 or, alternatively, to the metal layer 64 for RF coupling through the semi-insulative puck layer 60.

A very high heat transfer coefficient between the wafer 40 and the puck 60 is realized by maintaining a very high chucking force. A suitable range for this force depends upon the anticipated heat loading of the wafer, and will be discussed later in this specification. The heat transfer coefficient (having units of Watts/m$^{2\circ}$ K or heat flux density for a given temperature difference) of the wafer-to-puck contacting surfaces is adequate to remove heat at the rate heat is deposited on the wafer. Specifically, the heat transfer coefficient is adequate because during plasma processing it either limits the wafer temperature below a specified maximum temperature or limits the time rate of rise of the wafer temperature below a maximum rate of rise. The maximum wafer temperature may be selected to be anywhere in a practical range from on the order to 100 degrees C. or higher, depending upon the heat load. The maximum rate of heat rise during processing may be anywhere in a range from 3 to 20 degrees per second. Specific examples may be 20 degrees per second, or 10 degrees per second or 3 degrees per second. By comparison, if the wafer is uncooled, the rate of heat rise may be 86.7 degrees per second in the case of a typical 300 mm silicon wafer with a heat load of 7500 Watts, 80% of which is absorbed by the wafer. Thus, the rate of temperature rise is reduced to one-fourth of the un-cooled rate of heat rise in one embodiment of the invention.

Such performance is accomplished, first, by maintaining the puck at a sufficiently low temperature (for example, about 80° C. below the target wafer temperature), and second, by providing the top surface of the puck 60 with a sufficiently smooth finish (e.g., on the order of ten's of micro-inches RMS deviation, or preferably on the order of micro-inches RMS deviation). For this purpose, the top surface 60a of the puck 60 can be highly polished to a finish on the order of about 2 micro-inches RMS deviation, for example. Furthermore, heat is removed from the puck 60 by cooling the metal layer 64. For this reason, internal coolant passages 70 are provided within the metal layer 64 coupled to a coolant pump 72 and heat sink or cooling source 74. In an alternative embodiment, the internal cooling passages 70 may extend into the puck 60 or adjacent its back surface in addition or instead of extending through the metal layer 64. In any case, the coolant passages 70 are thermally coupled to the puck 60, either directly or through the metal layer 64, and are for cooling the puck 60. The coolant liquid circulating through the internal passages 70 can be water, ethylene glycol or a mixture, for example. Alternatively, the coolant may be a perfluorinated heat transfer liquid such as "fluorinert" (made by 3M company). Unlike the internal gas coolant passages of conventional chucks, this feature presents little or no risk of arcing in the presence of high RF bias power applied to the chuck 14 by the RF bias power generator 44.

One advantage of such contact-cooling of the wafer over the conventional method employing a coolant gas is that the thermal transfer efficiency between the coolant gas and each of the two surfaces (i.e., the puck surface and the wafer bottom surface) is very limited, in accordance with the thermal accommodation coefficient of the gas with the materials of the two surfaces. The heat transfer rate is attenuated by the product of the gas-to-wafer thermal accommodation coefficient and the gas-to-puck thermal accommodation coefficient. If both coefficients are about 0.5 (as a high rough estimate), then the wafer-gas-puck thermal conductance is attenuated by a factor of about 0.25. In contrast, the contact-cooling thermal conductance in the present invention has virtually no such attenuation, the thermal accommodation coefficient being in effect unity for the chuck 14 of FIGS. 1-4. Therefore, the contact cooling electrostatic chuck 14 can outperform conventional electrostatic chucks (i.e., electrostatic chucks that that employ gas cooling) by a factor of about four (or more) with sufficiently high attractive electrostatic force between wafer and puck. We have observed in preliminary tests an improvement of about a factor of three.

The heat transfer coefficient between the wafer 40 and the puck 60 in the wafer contact-cooling electrostatic chuck 14 is affected by the puck top surface finish and the chucking force. These parameters can be adjusted to achieve the requisite heat transfer coefficient for a particular environment. An important environmental factor determining the required heat transfer coefficient is the applied RF bias power level. It is believed that at least 80% of the RF bias power from the bias generator 44 is dissipated as heat in the wafer 40. Therefore, for example, if the RF bias power level is 7500 Watts and 80% of the RF bias power from the bias generator 44 is dissipated as heat in the wafer 40, if the wafer area is 706 cm$^2$ (300 mm diameter wafer) and if a 80 degrees C. temperature difference is allowed between the wafer 40 and the puck 60, then the required heat transfer coefficient is h=7500×80% Watts/(706 cm$^2$×80 degrees K), which is 1071 Watts/m$^{2\circ}$ K. For greater RF bias power levels, the heat transfer coefficient can be increased by augmenting any one or both of the foregoing factors, namely the temperature drop across the puck, the chucking force or the smoothness of the puck surface. Such a high heat transfer coefficient, rarely attained in conventional electrostatic chucks, is readily attained in the electrostatic chuck 14 of FIG. 2 by applying a sufficiently high chucking voltage, on the order of 1 kV, for example.

In addition, the heat transfer is improved by providing more puck surface area available for direct contact with the wafer backside. In a conventional chuck, the puck surface available for wafer contact is greatly reduced by the presence of open coolant gas channels machined, ground or otherwise formed in the puck surface. These channels occupy a large percentage of the puck surface. In the puck 60 of FIG. 3, the only interruptions in the surface are three small lift pin holes 80a, 80b, 80c. Therefore, the percentage of the puck cross-sectional area ($3.14r^2$) based upon the puck radius (r) that is available for direct wafer contact is significantly higher (i.e., 30%-95% of the total cross-sectional area of the chuck), thus maximizing the wafer-puck heat transfer coefficient. A related feature is that the surface contact area between the puck 60 and the cooled metal plate 64 is likewise a very high percentage of the total cross-sectional area of the plate 64. This is because, as shown in FIG. 4, the plate 64 has a top surface interrupted by corresponding lift pin holes 80a, 80b, 80c and center electrical conduit hole 82. Its bottom surface has, in addition, coolant ingress and egress holes 84a, 84b.

Figure 5:
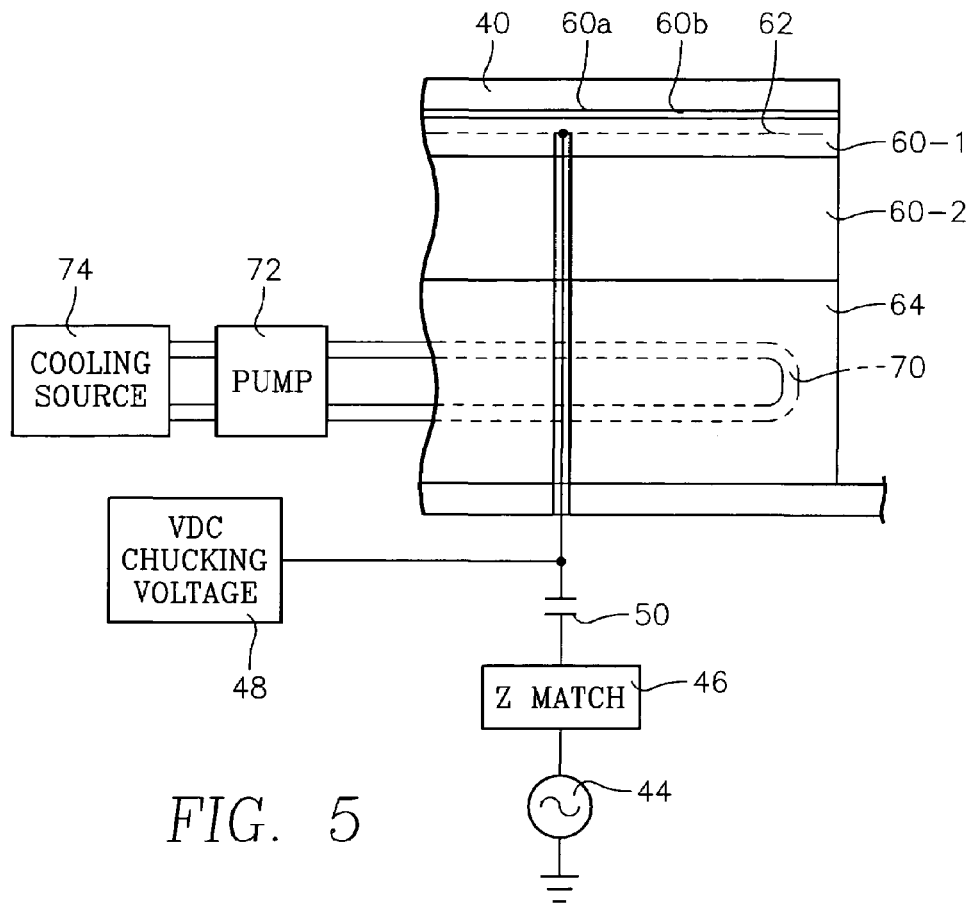
FIG. 5 illustrates an alternative implementation of the chuck of FIG. 2.

FIG. 5 illustrates an alternative implementation of the wafer contact-cooling electrostatic chuck of FIG. 2, in which the insulator layer 66 and the bottom metal layer 68 can be eliminated, while the puck 60 is modified to have two layers, an upper semi-insulative layer 60-1 (e.g., lower resistivity aluminum nitride) and a lower highly insulative (e.g., higher resistivity aluminum nitride) layer 60-2. In this implementation, the overall thickness of the puck 60 is greater, because the lower insulator layer 60-2 must be sufficiently thick to provide a certain RF capacitance selected by the system designer (requirement is typically to be less than some maximum value). The top puck layer 60-1 of FIG. 5 may be nearly identical to the puck 60 of FIG. 2.

Figure 6:
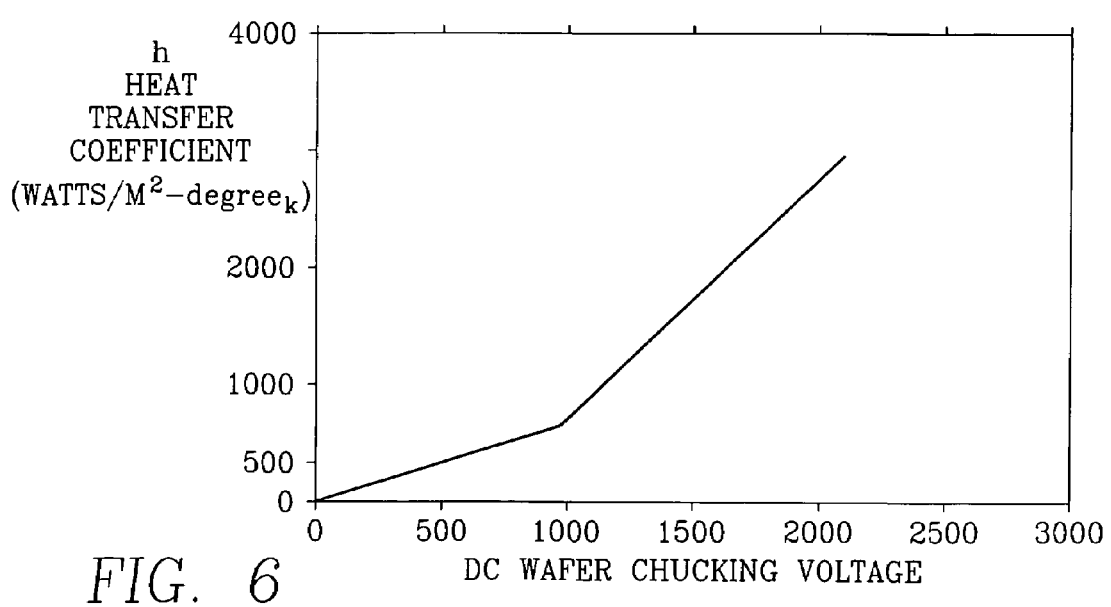
FIG. 6 illustrates the behavior of the heat transfer coefficient in the embodiment of FIG. 2 or 5 as a function of chucking voltage.

FIG. 6 is a graph illustrating the behavior of the heat transfer coefficient, h (vertical axis), as a function of the chucking voltage applied by the chucking voltage source 48 (horizontal axis). FIG. 6 shows that remarkably high heat transfer coefficient values (1000 to 3000 Watts/m$^{2\circ}$ K are obtained within a relatively modest range of chucking voltages (1000 to 2000 Volts D.C.).

Figure 7:
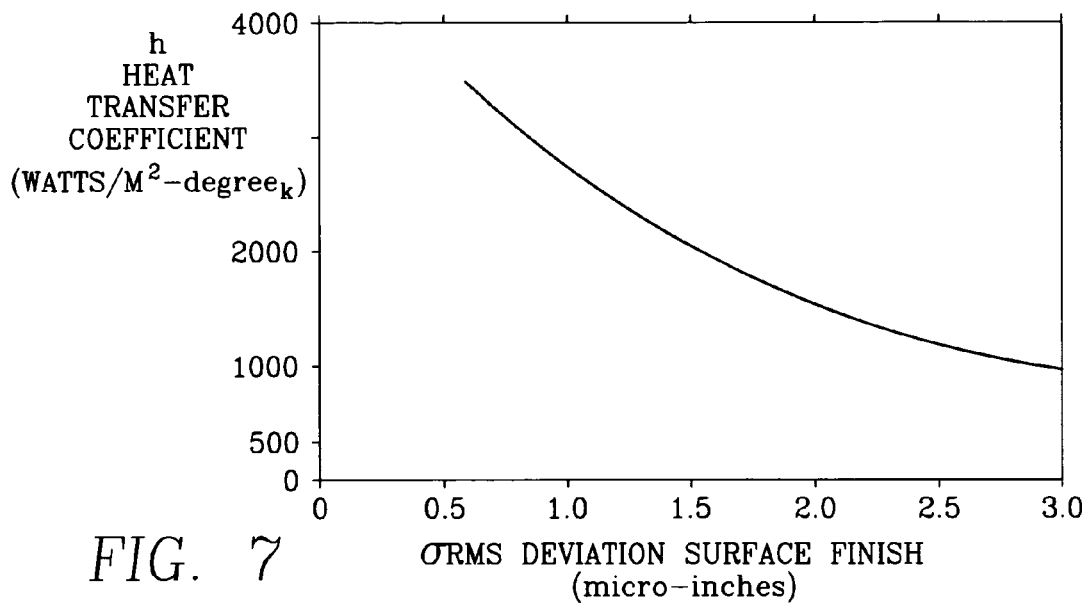
FIG. 7 illustrates the behavior of the heat transfer coefficient in the embodiment of FIG. 2 or 5 as a function of puck surface finish.

FIG. 7 is a graph illustrating the behavior of the heat transfer coefficient, h (vertical axis), as a function of the surface finish of the puck top surface 60a. FIG. 7 shows that robust heat transfer coefficient values (1000 to 3000 Watts/m$^{2\circ}$ K) are obtained within a practical range of surface finish values (1 to 3 micro-inches RMS).

Figure 8:
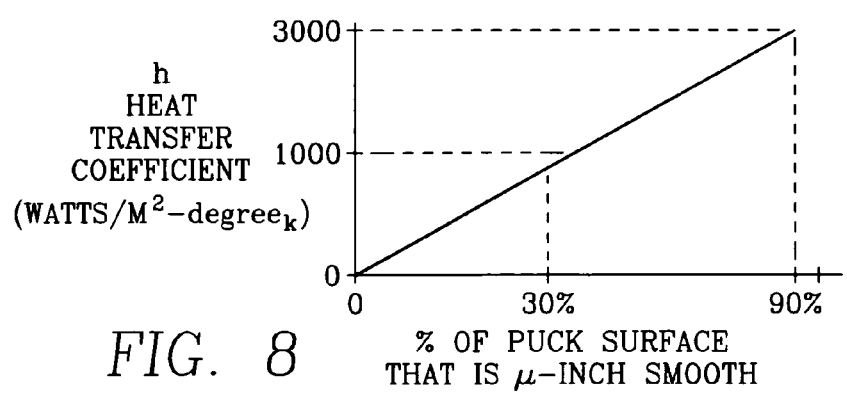
FIG. 8 illustrates the behavior of the heat transfer coefficient in the embodiment of FIG. 2 or 5 as a function of the proportion of the puck surface that is smooth.

FIG. 8 is a graph illustrating the behavior of the heat transfer coefficient, h (vertical axis), as a function of the percentage of the puck top surface 60a that is flat (e.g., not taken up by surface channels or holes). FIG. 8 shows that robust heat transfer coefficient values (1000 to 3000 Watts/m$^{2\circ}$ K) are obtained within a practical range of 30% to about 90%.

FIGS. 9A, 9B and 9C depict the wafer as it is first placed on the chuck 14 (of FIG. 2) prior to application of any chucking voltage (FIG. 9A), when the wafer is chucked to the puck with a minimal force (FIG. 9B), and when a very high chucking force is applied to realize a high heat transfer coefficient (FIG. 9C). Initially, the wafer has an equilibrium shape that includes a diameter-long bow (creating an initial puck-to-wafer air or vacuum gap) and many small ripples (FIG. 9A). In order to couple across the relatively large air gap of FIG. 9A, a very large chucking D.C. voltage must be applied to pull the wafer down to the puck, which removes the bow shape. This reduces the air gap, so that the wafer may now be held onto the chuck as in FIG. 9B with a much lower chucking voltage, since the effective gap is now miniscule (on the order of 5-10 microns or less). In FIG. 9B, the large bow in the wafer is eliminated, but the many ripples in the wafer shape persist. In order to ensure a large heat transfer coefficient sufficient to maintain wafer temperature at high RF bias power levels (e.g., 5-10 kWatts), a large chucking voltage must be applied, in the range of 1-4 kVolts. The large increase in chucking voltage deforms the wafer shape so that the ripples are at least partially flattened, but still can persist to a limited degree, as depicted in FIG. 9C. The greater chucking or contact force in FIG. 9C decreases the effective gap to as little as 1 micron or less, realizing a concomitant increase in wafer-puck heat transfer coefficient. FIG. 10 illustrates the chucking voltage as a function of time, corresponding to the sequence of FIGS. 9A through 9C. In FIG. 10, the high contact force chucking voltage is depicted as being less than the initial chucking voltage required to overcome the air gap when the wafer is first placed on the chuck. However, the high contact force chucking voltage may, instead, exceed the initial chucking voltage, as indicated in dashed line in FIG. 10. The application of an initially higher chucking voltage than the later applied chucking voltage may also improve the transient chucking force of the electrostatic chuck by driving the mobile charge more quickly to near the surface of the electrostatic chuck than otherwise possible with lower chucking voltage.

Figure 11:
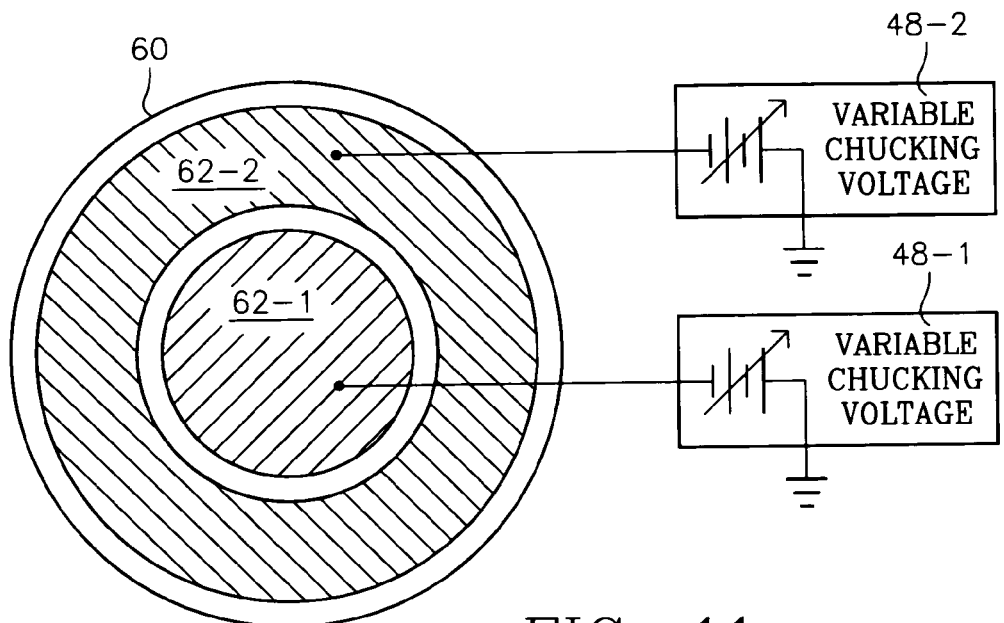
FIGS. 11 and 12 are top and side cut-away views, respectively, of an alternative embodiment of the electrostatic chuck of FIG. 2 in which the chucking electrode is divides into separate inner and outer chucking electrodes.
Figure 12:
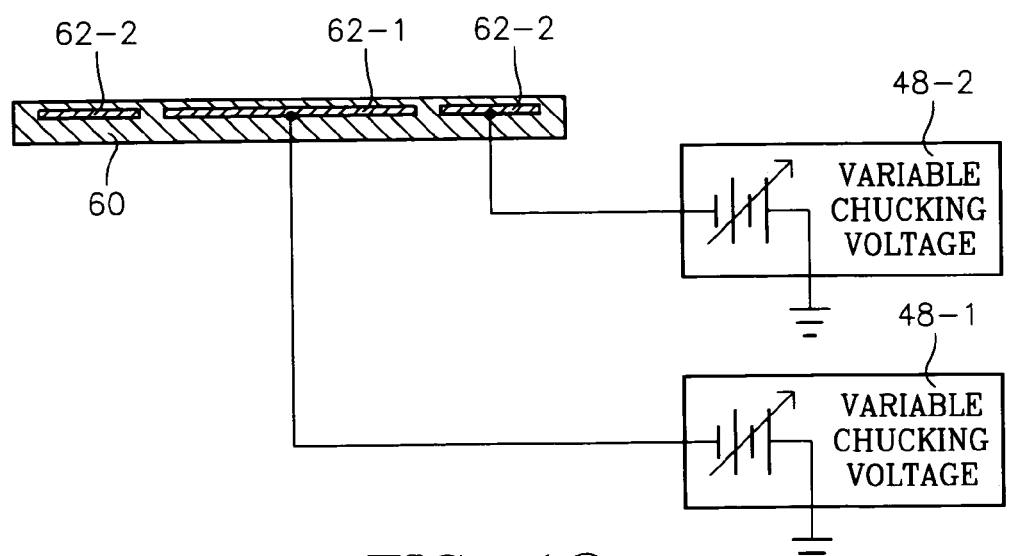

FIG. 11 is a cut-away top view of an embodiment of the puck 60 in which the electrode 62 is divided into two electrically separate electrodes, namely an inner electrode 62-1 and an outer electrode 62-2 surrounding the inner electrode 62-1. FIG. 12 is a cut-away side view of the puck of FIG. 11. The electrodes 62-1, 62-2 are connected to independently controllable variable chucking voltage sources 48-1, 48-2, so that different chucking forces may be applied to different radial portions of the wafer 40. This feature permits adjustment of the radial distribution of the heat transfer rate in order to compensate, for example, for non-uniform radial distribution of wafer heat loading.

Figure 13A:
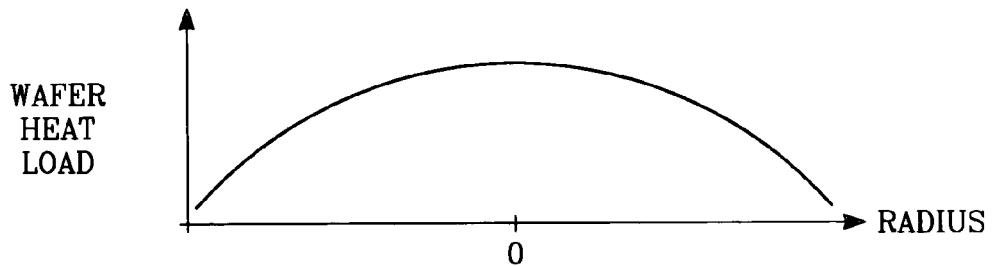
FIGS. 13A through 13D illustrate, respectively, a center-high radial distribution of heat load on the workpiece, the chuck voltages applied to the radially inner and outer electrodes, the corresponding radial distribution of heat transfer coefficient, and the resulting radial temperature distribution on the workpiece.
Figure 13B:
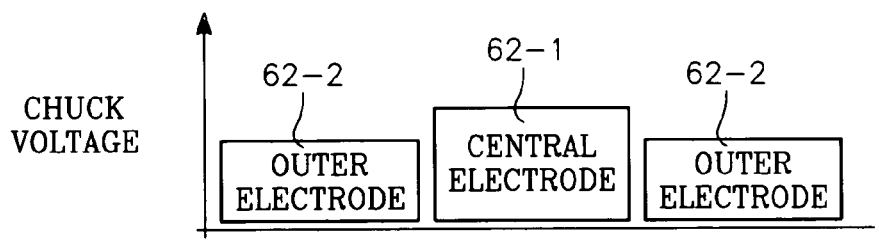
Figure 13C:
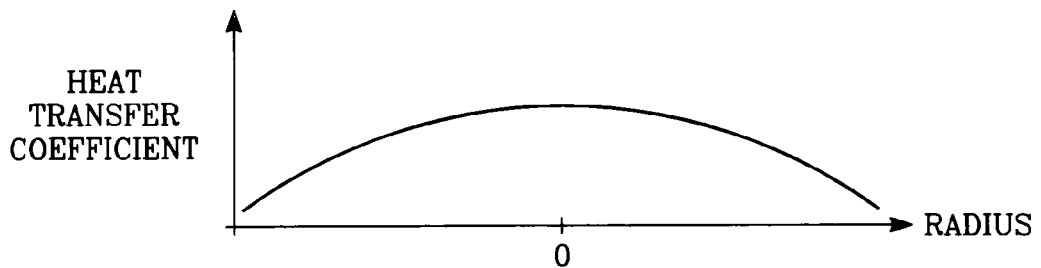
Figure 13D:
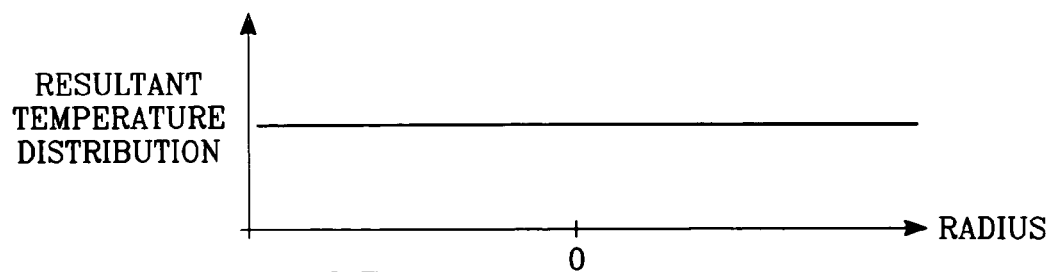

FIG. 13A is a graph of the radial distribution wafer heat load (or wafer temperature in the absence of any compensation), where more heat is directed to the wafer center and less to the wafer periphery (center-high heat loading). This condition may be compensated (to achieve uniform radial distribution of wafer temperature) by applying a higher voltage to the inner electrode 62-1 and a lower voltage to the outer electrode 62-2, as depicted in FIG. 13B. This produces a greater chucking force at the wafer center and a lesser chucking force at the wafer periphery, so that a center-high radial distribution of the heat transfer coefficient may be realized, as illustrated in the graph of FIG. 13C. The difference between the center-high heat transfer coefficient radial distribution and the center-high heat loading radial distribution, is nearly uniform across the diameter of the wafer, resulting in a nearly uniform radial distribution of wafer temperature, illustrated in FIG. 13D.

Figure 14A:
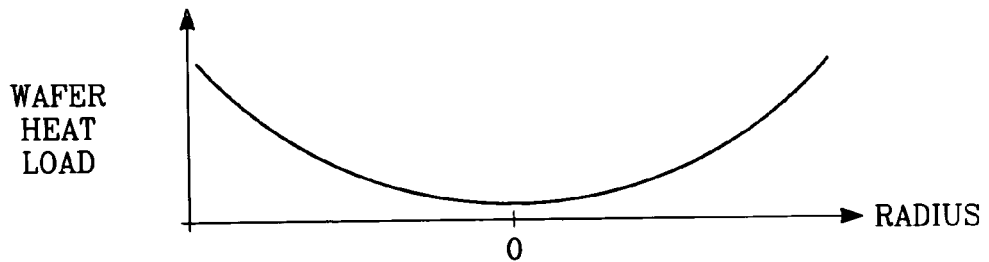
FIGS. 14A through 14D illustrate, respectively, a center-low radial distribution of heat load on the workpiece, the chuck voltages applied to the radially inner and outer electrodes, the corresponding radial distribution of heat transfer coefficient, and the resulting radial temperature distribution on the workpiece.
Figure 14B:
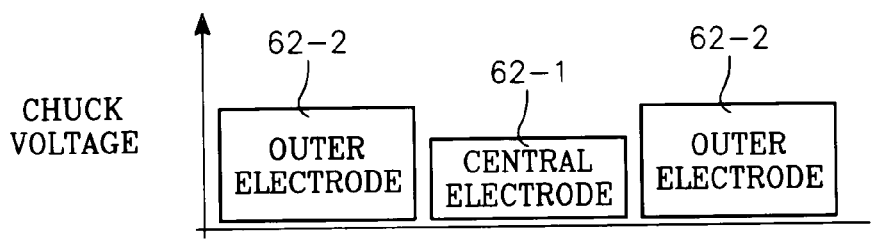
Figure 14C:
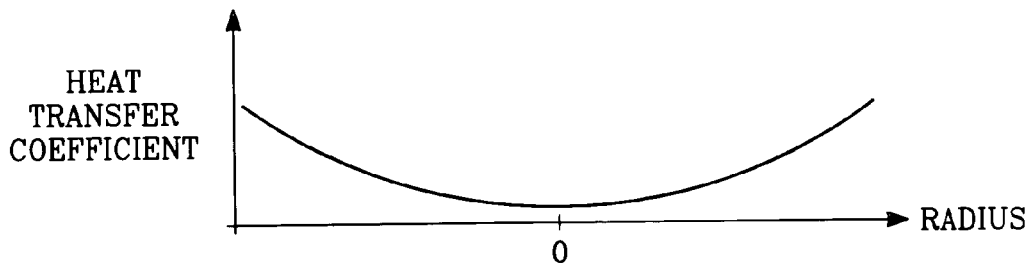
Figure 14D:
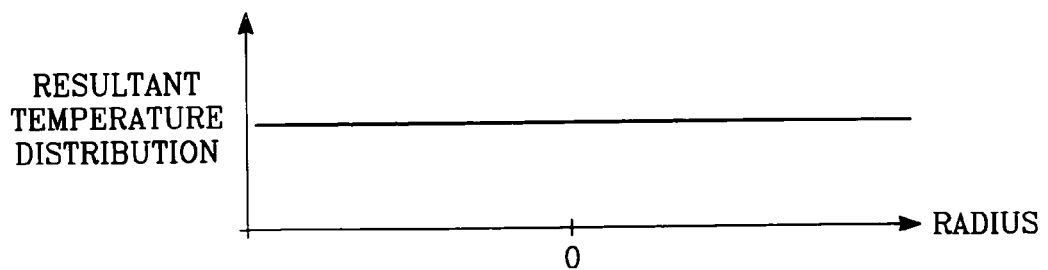

The opposite case is illustrated in FIGS. 14A-14D. FIG. 14A is a graph of the radial distribution wafer heat load (or wafer temperature in the absence of any compensation), where more heat is directed to the wafer periphery and less to the wafer center (center-low heat loading). This condition may be compensated (to achieve uniform radial distribution of wafer temperature) by applying a lower voltage to the inner electrode 62-1 and a higher voltage to the outer electrode 62-2, as depicted in FIG. 14B. This produces a greater chucking force at the wafer periphery and a lesser chucking force at the wafer periphery, so that a center-low radial distribution of the heat transfer coefficient may be realized, as illustrated in the graph of FIG. 14C. The difference between the center-low heat transfer coefficient radial distribution and the center-low heat loading radial distribution is nearly uniform across the entire wafer diameter, resulting in a nearly uniform radial distribution of wafer temperature, illustrated in FIG. 14D.

Figure 15:
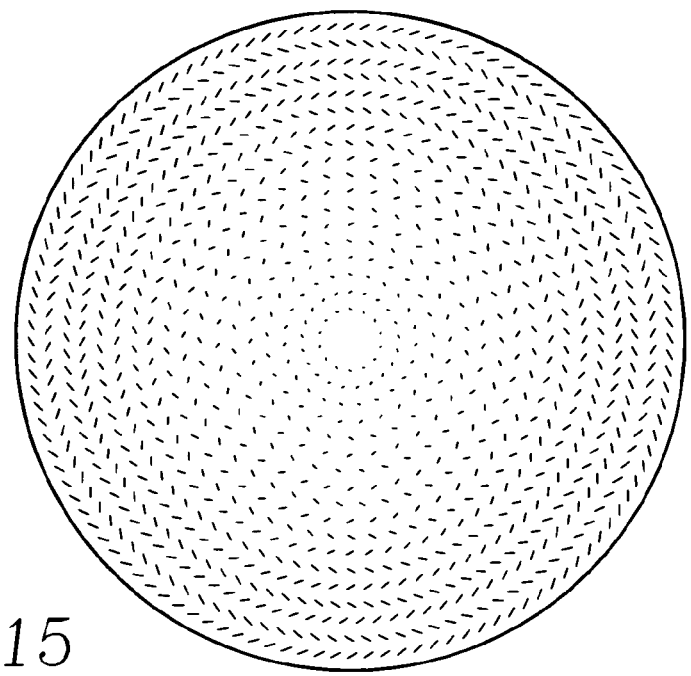
FIG. 15 illustrates a polished puck surface having a selected non-uniform radial distribution of finish smoothness.
Figure 16:
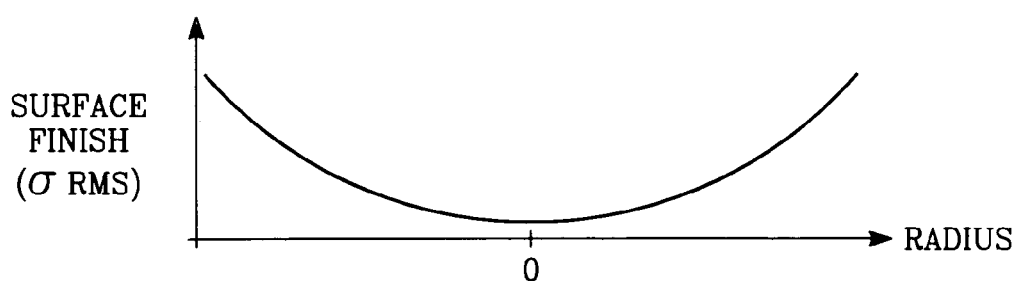
FIGS. 16 and 17 illustrate, respectively, center low and center high surface finishes in accordance with FIG. 15.

FIG. 15 depicts another way of obtaining a center-high or center-low radial distribution of heat transfer coefficient. In FIG. 15, the radial distribution of the surface finish is center-high (or center-low), depending upon whether the wafer heat loading is center high or center low. For example, if the wafer heat loading is center-high (as in FIG. 13A), then a center high radial distribution of heat transfer coefficient (as in FIG. 13B) is obtained by providing a smoother surface finish in the center of the puck top surface 60a and a less smooth finish at the periphery of the puck top surface 60a. Such a radial distribution of surface finish is depicted in the graph of FIG. 16, in which the RMS deviation of the surface finish (vertical axis) as a function of radius (horizontal axis) is center-low. This produces a center-high radial distribution of heat transfer coefficient (corresponding to FIG. 13C) with the result of a uniform radial distribution of wafer temperature (corresponding to FIG. 13D).

Figure 17:
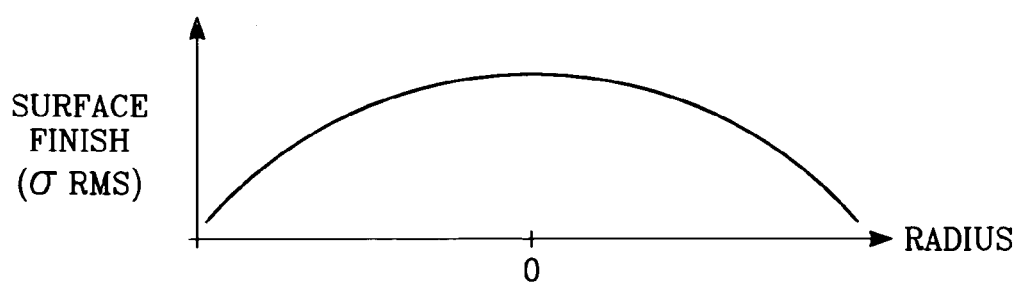

Also, if the wafer heat loading is center-low (as in FIG. 14A), then a center-low radial distribution of heat transfer coefficient (as in FIG. 14B) is obtained by providing a smoother surface finish at the periphery of the puck top surface 60a and a less smooth finish at the center of the puck top surface 60a. Such a radial distribution of surface finish is depicted in the graph of FIG. 17, in which the RMS deviation of the surface finish (vertical axis) as a function of radius (horizontal axis) is center-high. This produces a center-low radial distribution of heat transfer coefficient (corresponding to FIG. 14C) with the result of a uniform radial distribution of wafer temperature (corresponding to FIG. 14D).

Figure 18:
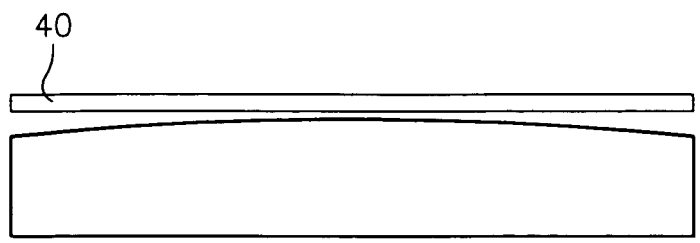
FIGS. 18 and 19 illustrate, respectively, convex and concave polished puck surfaces.
Figure 19:
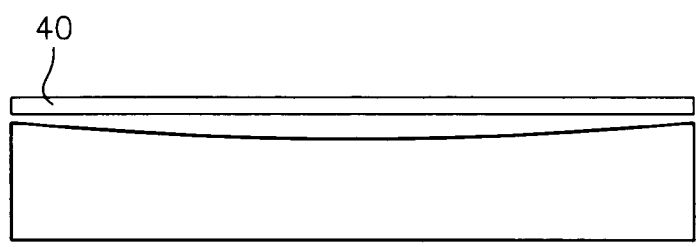

Another way of obtaining a center-high radial distribution of heat transfer coefficient is to make the puck surface slightly bowed with a center-high contour, as illustrated in FIG. 18. After the chucking voltage is applied, the resistance of the wafer to bending will result in less contact force at the wafer periphery and relatively greater contact force at the wafer center. Similarly, a way of obtaining a center-low radial distribution of heat transfer coefficient is to make the puck surface slightly bowed with a center-low contour, as illustrated in FIG. 19. After a chucking voltage is applied, the resistance of the wafer to bending will result in less contact force at the wafer center, in this case, and relatively greater contact force at the wafer periphery.

Figure 20:
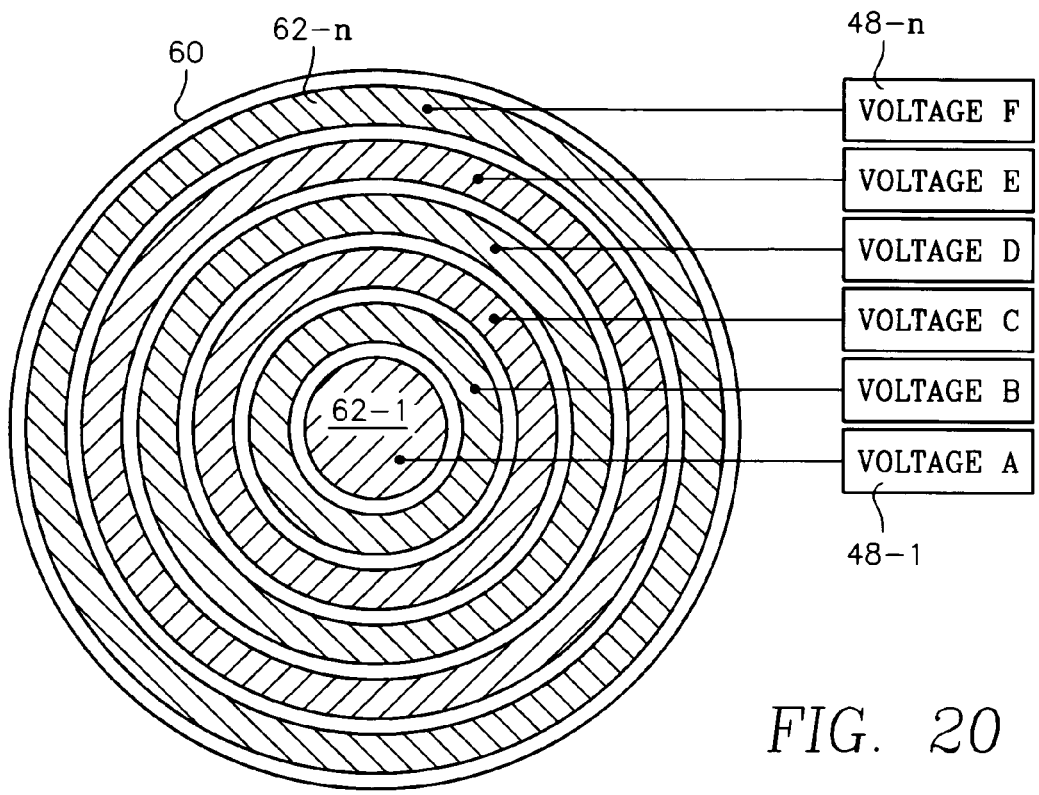
FIGS. 20 and 21 are top and side cut away views, respectively of a variation of the embodiment of FIG. 11 having many radially separate chucking electrodes.
Figure 21:
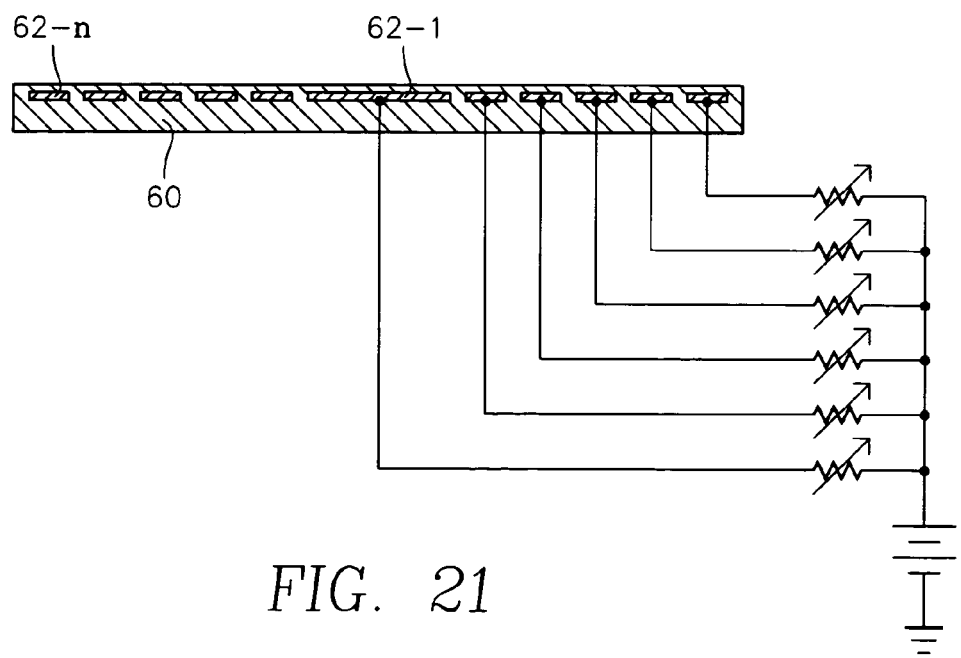

FIGS. 20 and 21 illustrate a modification of the concept of FIG. 11, in which many (i.e., n) electrodes 62-1 through 62-n are distributed among different radial zones of the puck 60, the electrode being separately controlled by independent chucking voltage sources 48-1 through 48-n. This embodiment provides a finer resolution in shaping the radial distribution of chucking force, and also provides for greater flexibility in constructing more complex radial distributions of the heat transfer coefficient.

Figure 22:
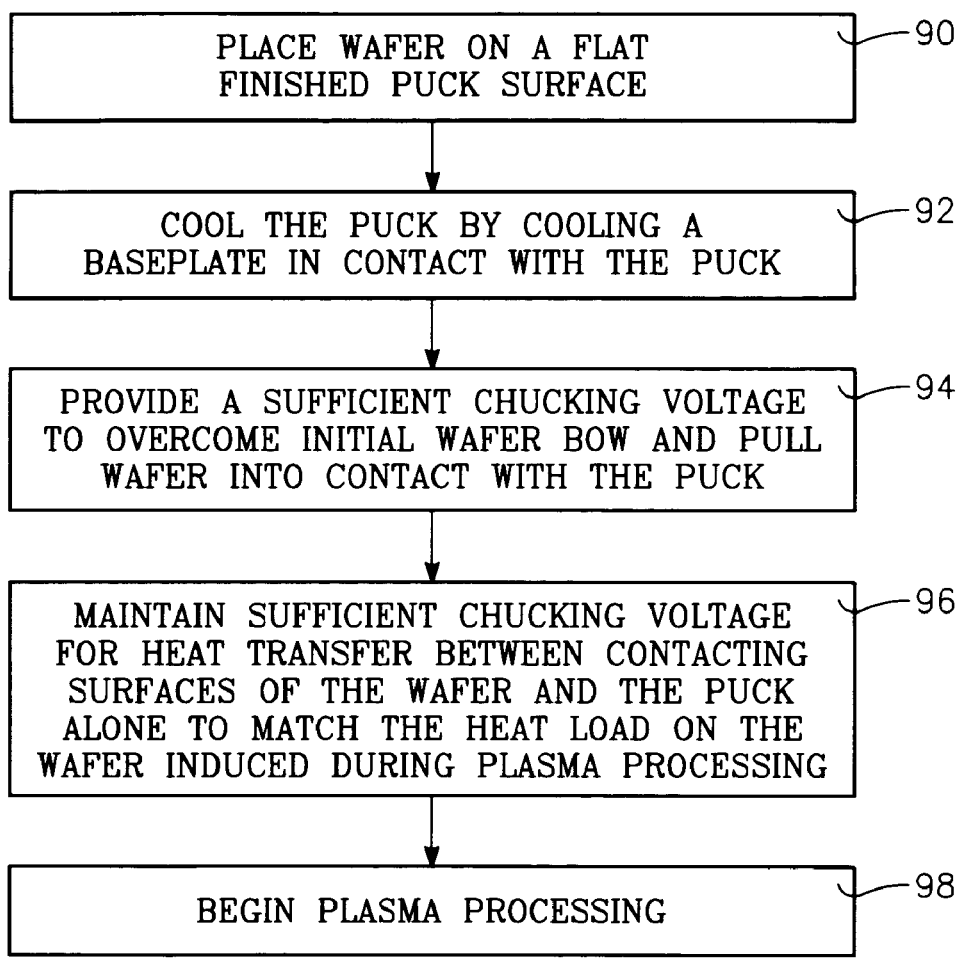
FIG. 22 is a block flow diagram of a method of the invention.

FIG. 22 depicts a method carried out with the wafer contact-cooling electrostatic chuck of FIG. 2 or 5. First, the wafer 40 is placed on the flat finished surface of the puck 60 (block 90 of FIG. 22). The puck 60 is cooled by pumping a liquid coolant through the metal layer 64 (block 92). The chuck voltage is set to a sufficient magnitude to pull the wafer 40 into contact with the top surface of the puck 60a (block 94). The chuck voltage is then set to a magnitude at which the heat transfer coefficient between contacting surfaces of the puck 60a and wafer 40 is sufficient to remove heat from the wafer at a rate which limits the maximum wafer temperature or the rate of rise of wafer temperature. Alternatively, the chucking voltage is selected to provide a sufficient chucking force to attain a selected heat transfer coefficient between contacting surfaces of the puck and wafer such that the wafer temperature is controlled (block 96). Plasma processing of the wafer is then commenced (block 98).

The chucking voltage required to attain a particular heat transfer coefficient is increased if an insulating (oxide or nitride, for example) layer is added to the wafer backside. Therefore, the chucking voltage must be determined empirically each time a new batch of wafers is to be processed. This is inconvenient and reduces productivity. One way around this problem is to mask the difference between wafers with and without a backside oxide layer. The difference is masked by adding a thin insulating layer 60b on the top puck surface 60a. The presence of such a thin insulating layer increases the requisite chucking voltage to reach a particular heat transfer coefficient value. The advantage is that the chucking voltage required remains at least nearly the same whether or not the wafer backside has an insulating layer.

Another problem is that of contamination. Contamination is nearly prevented prior to processing of the wafer by seasoning both the chamber interior surfaces and the puck top surface 60a simultaneously (in the absence of the wafer) by depositing a thin layer consisting of a material that is compatible with the plasma process that is to be performed. Such a seasoning layer, in addition to suppressing contamination, may also serve as the high resistance insulating layer 60b on the puck top surface 60a that masks differences between wafers with and without an oxide on their backside. A thin (e.g., on the order of a thousand angstroms or up to one micron or more) seasoning layer 60b may be deposited on the puck top surface 60a. The seasoning layer 60b may be formed of silicon dioxide or germanium dioxide, silicon nitride or germanium nitride, silicon carbide, aluminum nitride or aluminum oxide, a fluorocarbon polymer, a fluorohydrocarbon polymer, a nitride of a silicon hydride, a hydrocarbon, or (less desirably) hydrides of silicon or germanium. The seasoning layer 60b is deposited by forming a plasma containing precursors of the desired material for a sufficient length of time to deposit a layer having a thickness on the order of about a thousand angstroms or up to one micron or more on the interior chamber surfaces, including the puck top surface 60a. This forms the seasoning layer 60b over the puck 60 as well as a seasoning layer over all internal chamber surfaces and is done before the wafer is placed on the chuck 14. Thereafter, the wafer is placed on the surface of the seasoning layer 60b, and plasma processing is performed. After the wafer is removed (or after a large number of wafers has been processed in similar fashion), the seasoning layer 60b is removed. Removal of the seasoning layer 60b is performed by either furnishing radicals into the chamber or by reactive ion etching. For example, if the seasoning layer is silicon dioxide, then NF3 or F radicals may be used to remove it. If the seasoning layer is a fluorocarbon, fluorohydrocarbon or a hydrocarbon, then oxygen may be used in the form of either atomic oxygen or reactive oxygen ions, to remove the seasoning layer. The radicals (or ions) used to remove the seasoning layer may be produced in another external plasma reactor and then transferred into the reactor of FIG. 1. Alternatively, the radicals or ions may be produced within the chamber of FIG. 1 itself for removal of the seasoning layer.

Figure 23:
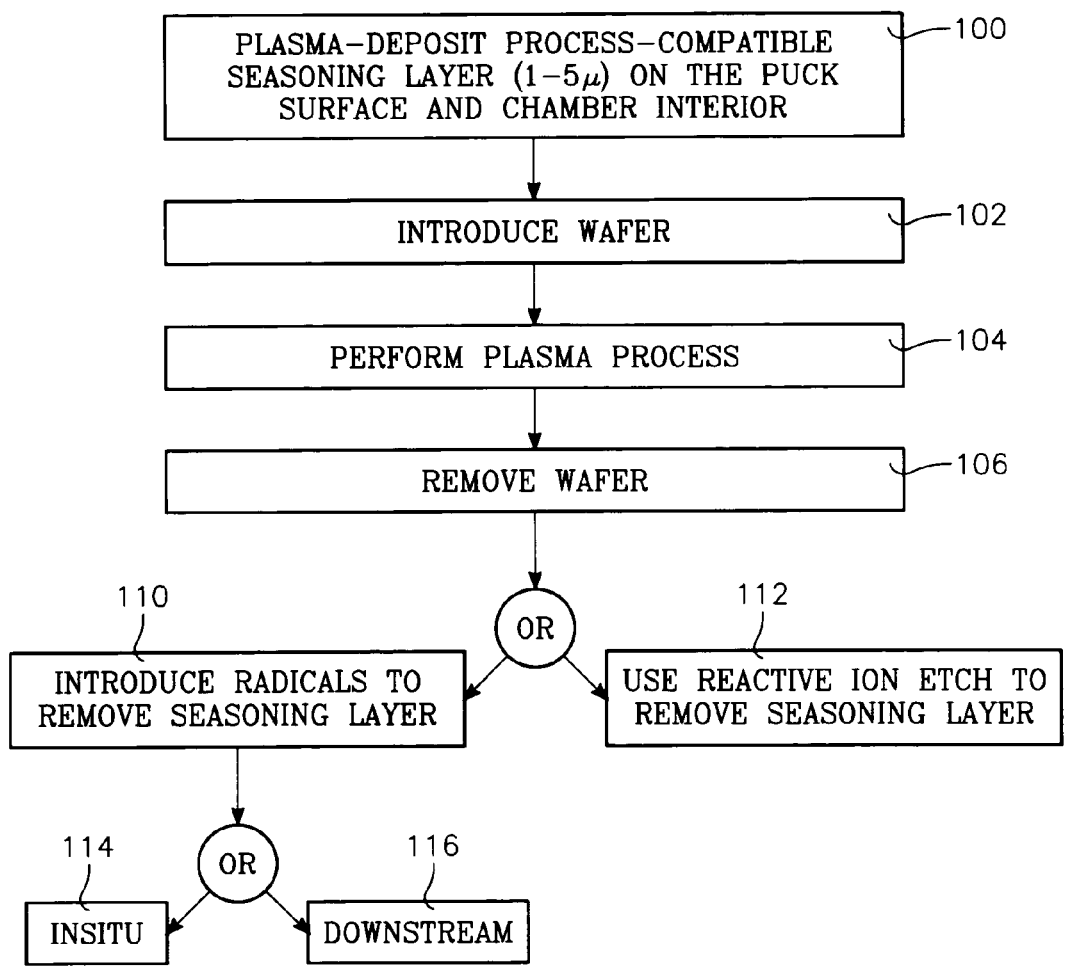
FIG. 23 is a block flow diagram of a method of the invention including plasma chamber pre-process seasoning.

FIG. 23 illustrates a process for depositing, using, and then removing a seasoning layer. Before the wafer is placed on the chuck, a plasma is formed containing precursors of the material to be deposited as a seasoning layer (block 100). This plasma is maintained for a sufficient duration to deposit about a micron thick layer on the internal chamber surfaces, including the puck top surface 60a. Then, the wafer is introduced (block 102), the plasma process is carried out (block 104) and the wafer is removed (block 106). The seasoning layer is then removed by either introducing appropriate radicals into the chamber (block 110) or by reactive ion etching (block 112). If the seasoning layer is removed by radicals, then the radicals may be formed in the reactor chamber itself (block 114) or may be supplied from another plasma reactor (block 116).

Figure 24:
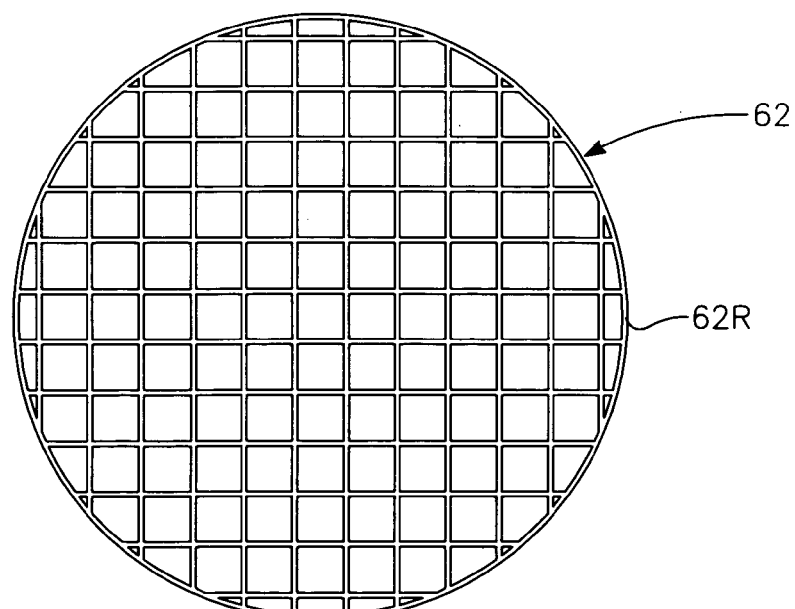
FIG. 24 illustrates an chucking electrode implemented as a wire mesh having a closed circumference.

FIG. 24 illustrates a wire mesh employed as the electrode 62. The mesh may be finer and therefore have a larger number of wires than the example shown in FIG. 24. A wire mesh is employed instead of a solid metal electrode in order to permit a uniform bonding between the puck 60 and the aluminum layer 64 across the entire diameter of the puck 60. The wire mesh of FIG. 24 has a circular shape matching the circular cross-section of the puck 60, and may be formed of molybdenum. In order to minimize discontinuities and sharp transitions in the edge electrical field of the electrode 62, the wires along the periphery or circumference are preferably terminated in a circular wire 62-R having a diameter that matches that of the circumference of the electrode 62. Alternatively, a perforated metal electrode may be used.

The wafer contact cooling electrostatic chuck of FIG. 2 or 5 is particularly useful for application in a plasma immersion ion implantation (P3i) capable of performing deep implanted junctions. Such a reactor applies a very high bias voltage to the chuck, requiring a chuck and cathode design capable of withstanding such high voltages without arcing. Specifically, the wafer contact-cooling electrostatic chuck of FIG. 2 or 5 is able to withstand very high bias power (7.5 KW bias power) and voltage (greater than 9 kV peak-to-peak cathode voltage) without photoresist reticulation or significant PR etch and without dielectric breakdown, gas breakdown or arcing of the electrostatic chuck.

The invention is applicable to etch, CVD (low-temperature), plasma immersion ion implantation (as applied to junction formation or doping, materials modification) beamline ion implantation, physical vapor deposition, chamber precleaning and the like. With the electrostatic chuck of FIG. 2 or 5, gas cooling is not required to obtain very good heat transfer. The elimination of the gas cooling holes or open channels in the puck top surface and the resulting elimination or reduction of electric field discontinuities (high E-field magnitude in gas filled holes) provides a much higher voltage capability without gas breakdown or arcing. In addition, better (lower) wafer backside particle counts are possible than competing designs such as a ceramic chuck with mesas forming open gas circulation channels. A ceramic chuck scratches the back of the wafer and forms particles to a much greater degree than a polished chuck against polished surface. Plasma-spray coated chucks can also use the polished, high-contact area approach. We have found that the wafer contact-cooling electrostatic chuck of FIG. 2 can tolerate without arcing an applied RF bias power level of at least 9 kWatts, provides a heat transfer coefficient of several thousand Watts/m$^{2o}$ K and contributes so little contamination that the particle count on the wafer can be limited to less than several tens of thousands of particles per wafer to less than several hundred particles. By using the method described to deposit a seasoning layer directly on the puck, the composition of the contributed particles can be limited to the composition of the seasoning layer or the composition of the wafer backside (such as Si, SiOx, SiN, etc). These types of particles are not typically considered contaminants as they do not generally detract from device performance.

RF Powered Process Kit

Figure 25:
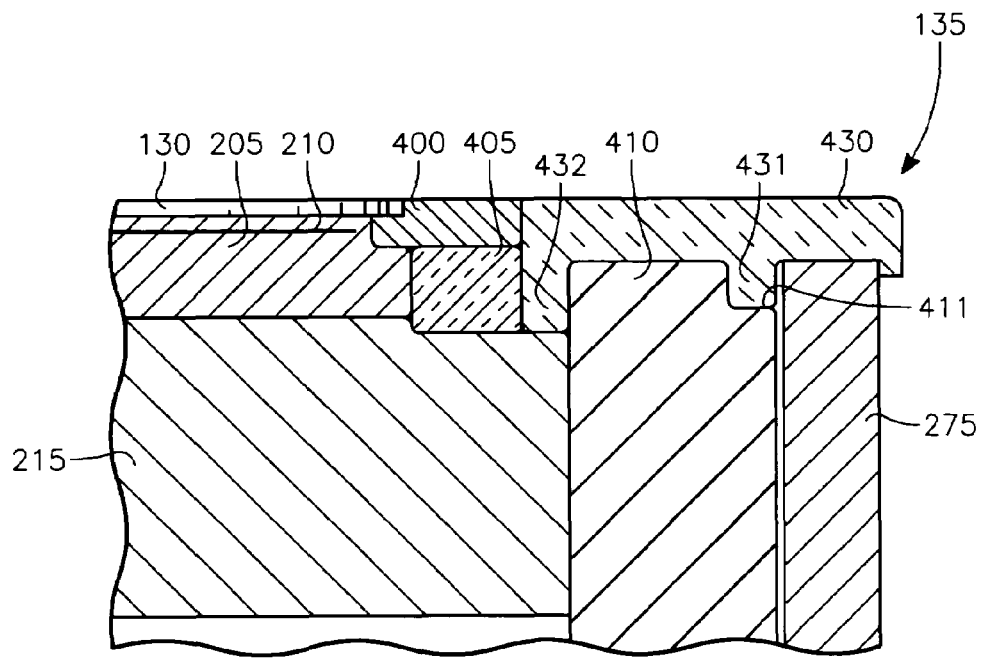
FIG. 25 is an enlarged view of an upper corner of the electrostatic wafer support chuck of FIG. 2.

FIG. 25 is an enlarged view of an upper corner of the electrostatic wafer support chuck of FIG. 2. The edge of the wafer 130 (corresponding to the wafer 40 of FIG. 2) and the portion of the wafer 130 overhanging the puck 205 (corresponding to the puck 60 of FIG. 2) is nested in a shoulder of a collar 400 consisting of a process-compatible material. Such a process compatible material may be silicon, silicon carbide or quartz for a silicon dioxide etch process for example. For an aluminum etch process, a process compatible material would be alumina or aluminum nitride for example. If the collar is quartz, then it has a dielectric constant of about 4. The collar 400 can have an axial thickness about one-third the thickness of the puck 205. The collar 400 rests on a high capacitance RF coupling ring 405 whose thickness is about two-thirds of the puck 205, so that the collar 400 and the ring 405 surround the entire puck 205. The high capacitance RF coupling ring 405 may be formed of a ceramic material so as to have a very high dielectric constant, such as about 9. In order to block plasma penetration to the electrostatic chuck (ESC) base 215 (the base 215 corresponding to the metal layer 64 of FIG. 2), the collar 400 extends radially inwardly from the wafer edge and radially outwardly from the outer edge of the ring 405. The dielectric constant of the ceramic ring 405 is high (e.g., typically greater than or equal to than that of the puck 205) so that the ceramic ring 405 provides high capacitive coupling of RF bias power from the ESC base 215 to the plasma over the wafer periphery. The radial thickness of the ring 405, the axial thickness of the ring 405 and its dielectric constant are selected to provide sufficient enhancement of capacitive coupling to the plasma over the wafer periphery to overcome the problems of poor process performance near the wafer periphery. This feature is facilitated by the ESC base 215 under the ring 405 being directly driven with RF bias power, an optional feature described above with reference to FIG. 2. In order to avoid losses to plasma in the pumping annulus, an annular quartz spacer 410 provides radial displacement between the metal ESC base 215 and a cathode liner 275. The cathode liner may be formed of a process-compatible material or of a metal such as aluminum, for example. The spacer 410 can be formed of quartz and fills in the void between the ESC base 215 and the cathode liner 275. Such a void would otherwise fill with gas that might become ionized. To avoid such internal plasma ignition in various parts of the wafer support pedestal 135, all of the gaps between adjoining structural elements (for example, the gaps between the ESC base 215, the spacer 410 and the cathode liner 275) are smaller than the plasma sheath thickness.

Figure 26:
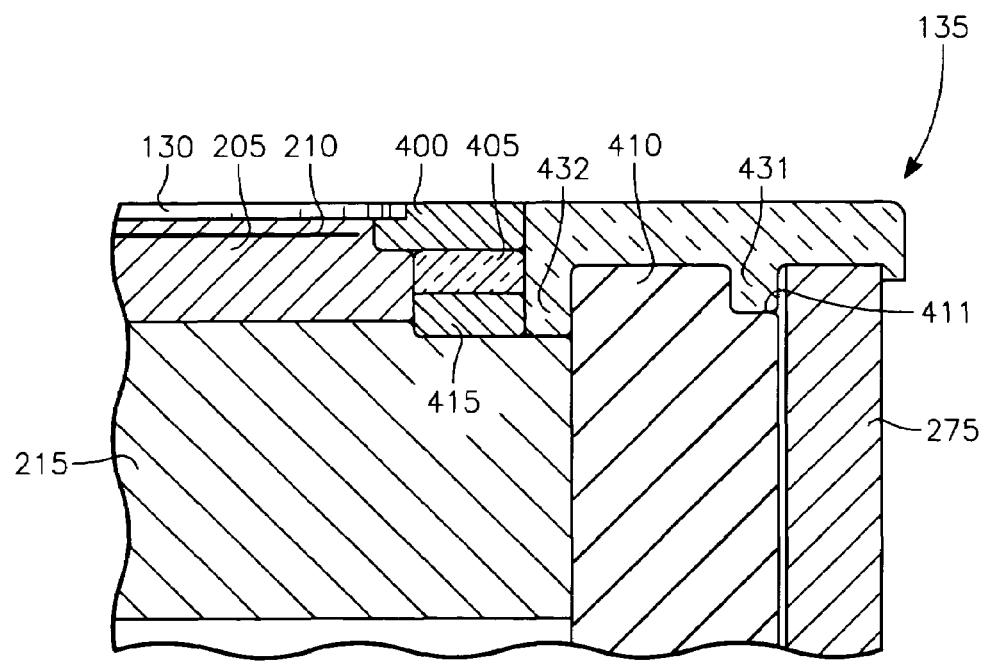
FIG. 26 is a corresponding view of a variation of the embodiment of FIG. 25.

Thus, the high dielectric constant of the ceramic ring 405 provides greater capacitive coupling of RF power from the ESC base 215 to plasma overlying the wafer periphery. The effective capacitance per unit area near the wafer pedestal will be the series combination of the capacitances per unit area of the ceramic ring (a large capacitance) and of the collar 400 (a smaller capacitance). By thus increasing the electric field over the wafer periphery, the problems encountered at the wafer periphery in conventional reactors, such as poor etch profile due to non-perpendicular electric fields, poor etch rate and depth, tendency toward etch stopping in high aspect ratio openings The degree to which the capacitive coupling of RF power from the ESC base 215 to plasma over the wafer periphery needs to be enhanced can be determined empirically for each process that is to be performed. This need can arise from a number of factors. For example, the portion of the wafer 130 overhanging the edge of the puck 205 overlies the silicon (or silicon carbide) collar but is separated therefrom by an air gap of about 3 to 7 mils, the air gap having relatively low dielectric constant (e.g., 1). This aspect suppresses capacitive coupling of RF power to plasma over the peripheral portion of the wafer 130. The needed increase in capacitive coupling at the wafer periphery may be determined on the basis of the radial distribution of etch rate, or the radial distribution of etch profile, or other parameters, for example. Once the determination is made, the capacitive coupling by the ceramic ring 405 that provides the requisite enhancement can be found for example by trial and error, or possibly by analytical methods. This capacitive coupling of the ring 405 can be controlled by appropriate selection of the dielectric constant of the ceramic ring 405, of the axial thickness of the ceramic ring 405 and of the radial thickness of the axial ring 405. The axial thickness can be greatly reduced from that illustrated in FIG. 25. For example, FIG. 26 illustrates a case in which the axial thickness of the ceramic ring 405 has been reduced to such an extent that an aluminum filler ring 415 is employed to fill the void left by reduction of the axial thickness of the ceramic ring 405.

A low capacitance quartz cover 430 (dielectric constant of about 4) overlies the quartz spacer 410 and the cathode liner 275. The quartz spacer 430 has a first leg 431 nesting in an outer corner 411 of the quartz spacer 410 and a second leg 432 extending axially between the quartz spacer 410 on one side and the collar 400 and ring 405 on the other side. A portion of the second leg 432 extends below an outer portion of the collar 400, so that the gap between the cover 430 and the components 275, 410, 215 underlying it meanders to prevent plasma leakage therethrough. It should be noted that this approach is followed throughout the design of the entire wafer support pedestal 135, so that contiguous air (or vacuum) gaps or passages tend to meander in order to suppress plasma leakage and promote recombination.

In summary, the radial and axial thicknesses of the ceramic ring 405 and its dielectric constant are selected to achieve a radial distribution of capacitance per unit area over the aluminum ESC base 215 that is sufficiently greater at the periphery than at the center to compensate for inherent factors that would otherwise tend to distort process performance. For example, the capacitance per unit area provided by the ceramic ring 405 is sufficiently greater than that of the ESC puck 205 so as to achieve a more nearly uniform radial distribution of etch rate or etch profile, for example. Since the ESC base 215 is driven with the bias RF power generator, it is spaced from the grounded cathode liner 275 by the quartz spacer 410. The spacing provided by the quartz spacer 410 is sufficiently large and the dielectric constant of the quartz spacer 410 is sufficiently small to avoid or prevent arcing and/or gas breakdown between the base 215 and the liner 275.

The RF potential of the ESC base 215 with respect to the ESC electrode 210 is governed by the manner in which it is coupled to the RF power output of the impedance match element 46. In one case, it is connected directly to the RF power output and is therefore at maximum RF potential. In another case, optional reactive elements are connected between the ESC base 215 and the ESC electrode 210 so that the RF potential is divided between the ESC electrode 210 and the ESC base 215. This latter option reduces the RF potential on the ESC base 215 and therefore reduces the amount of RF power that can be coupled from the ESC base 215 via the ceramic ring 405 to plasma at the wafer periphery to compensate for roll-off of the electric field beyond the edge of the puck 205.

Figure 27:
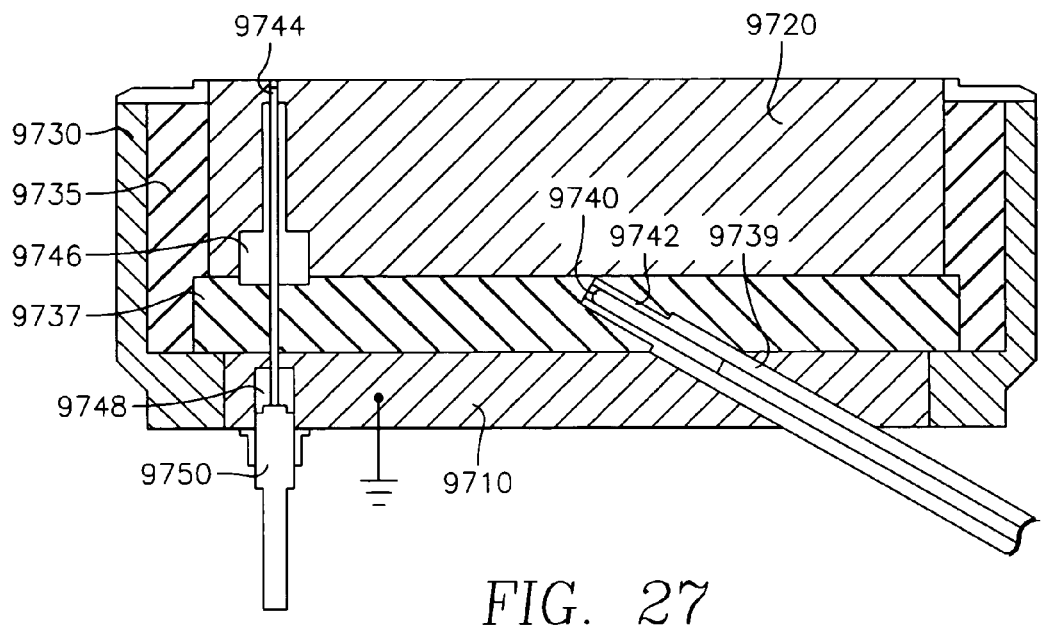
FIG. 27 depicts an embodiment of the electrostatic chuck of FIG. 2 capable of withstanding extremely high RF bias power and RF bias voltage levels without arcing.

FIG. 27 depicts an embodiment of the electrostatic chuck of FIG. 2 capable of withstanding extremely high RF bias power and RF bias voltage levels without arcing. Depending upon the desired junction depth, the RF bias voltage applied to the electrostatic chuck by the RF bias power generator 44 of FIG. 1 may be relatively small (e.g., 500 volts) for a shallow junction or relatively large (e.g., 5,000 volts) for a deeper junction. Some applications may require an RF bias voltage of over 10,000 volts. Such large voltages can cause arcing within the electrostatic chuck. Such arcing distorts process conditions in the reactor. In order to enable the electrostatic chuck to withstand bias voltages as high a 10,000 volts, for example, without arcing, voids within the chuck are filled with a dielectric filler material having a high breakdown voltage, such as Rexolite®, a product manufactured by C-Lec Plastics, Inc. Another common material is polycarbonate (Lexan®).

Figure 28:
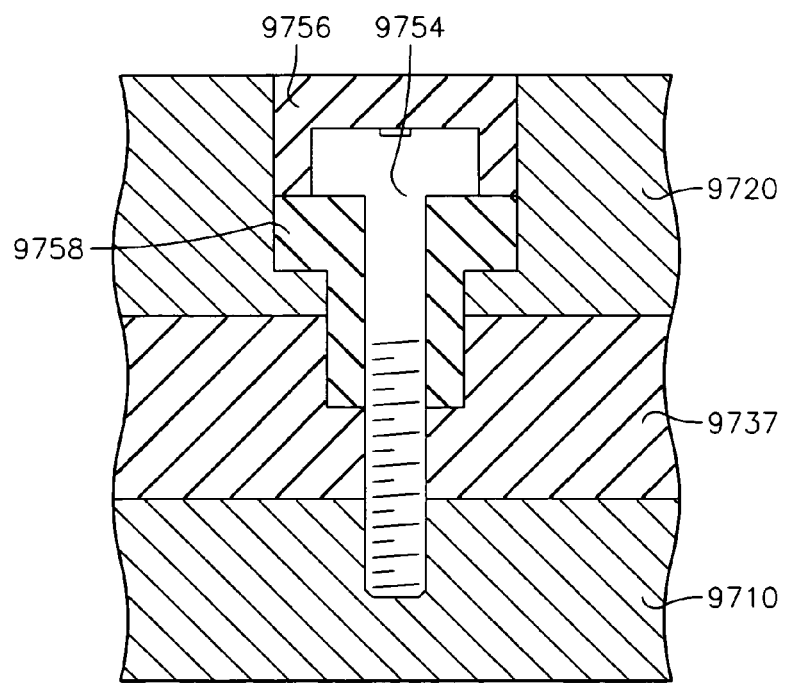
FIG. 28 is a detailed view of an assembly with the embodiment of FIG. 27.

The high voltage electrostatic chuck of FIG. 27 includes a grounded metal base plate 9710 (corresponding to the grounded base 68 of FIG. 2), a metal RF cathode plate 9720 (corresponding to the metal plate 64 of FIG. 2) and a cylindrical side wall 9730. Not shown in FIG. 27 are the semi-insulating layer or puck 60 and the electrode 62. Dielectric filler material 9735 fills voids between the side wall 9730 and the metal plate 9720. Dielectric filler material 9737 (corresponding to the insulator layer 66 of FIG. 2) fills voids between the metal plate 9720 and the base plate 9710. A coaxial RF conductor 9739 carrying the RF bias power from the RF bias power generator 44 (not shown in FIG. 27) is terminated in a narrow cylindrical conductive center plug 9740 that fits tightly within a matching conductive receptacle 9742 of the metal cathode plate 9720. A wafer lift pin 9744 (one of three) extends through the metal plate 9720, the dielectric layer 9737 and the grounded base plate 9710. The lift pin 9744 is tightly held within the metal plate 9720 by a surrounding blanket 9746 of the dielectric filler material. A void 9748 that accommodates a guide 9750 of the lift pin 9744 is located entirely within the base plate 9710 so as to minimize the risk of arcing within the void 9748. Referring to FIG. 28, bolt 9754 (one of several) holding the base plate 9710 and the electrostatic chuck plate 9720 together is completely encapsulated to eliminate any voids around the bolt 9754, with dielectric layers 9756, 9758 surrounding exposed portions of the bolt 9754. The foregoing features have been found to enable the wafer support pedestal to withstand an RF bias voltage of over 10,000 volts without experiencing arcing.

While the invention has been described in detail with specific reference to preferred embodiments, it is understood that variations and modifications thereof may be made without departing from the true spirit and scope of the invention.

What is claimed is:

1. A method of processing a workpiece in a plasma reactor, comprising:
providing a polished surface on a puck in the reactor;
placing the workpiece over the polished surface of the puck;
cooling the puck;
heating said workpiece by coupling RF power to plasma in said reactor;
introducing a process gas into said reactor;
applying a chucking voltage to a chucking electrode of the puck to pull the workpiece into direct contact with a top surface of the puck with sufficient electrostatic force to remove heat from the workpiece through directly contacting surfaces of the puck and workpiece at about the rate at which heat is deposited in the workpiece; and maintaining the temperature of said workpiece within a desired temperature range by controlling said chucking voltage.

2. The method of claim 1 further comprising providing a charge-mobile layer in said puck between said chucking electrode and said polished surface of said puck, and wherein the step of applying a chucking voltage causes mobile charge to travel across said charge mobile layer so as to enhance said electrostatic force.

3. The method of claim 1 wherein the step of coupling RF power comprises applying RF power at a power density in excess of about 5 Watts/sq. cm on said workpiece.

4. The method of claim 3 wherein said power density is in excess of about 6 Watts/sq. cm.

5. The method of claim 3 wherein said power density is in excess of about 7 Watts/sq. cm.

6. The method of claim 3 wherein the step of coupling RF power to plasma further comprises generating an RF bias voltage on said workpiece in excess of about 4 kV peak-to-peak.

7. The method of claim 1 wherein the step of heating said workpiece by coupling RF power to plasma in the reactor comprises indirectly heating the wafer with RF power by coupling RF plasma source power directly to plasma in the reactor, whereby said workpiece is heated by interaction with the plasma.

8. The method of claim 1 wherein said chucking voltage is sufficient to attain an electrostatic pressure in excess of about 20 T.

9. The method of claim 1 wherein said chucking voltage is sufficient to limit the temperature of said workpiece below a certain maximum temperature.

10. The method of claim 9 wherein said maximum temperature is on the order of about 700 degrees C.

11. The method of claim 3 wherein:
said chucking voltage is sufficient to limit the temperature of said workpiece below a certain maximum temperature; and
the step of coupling RF power comprises coupling RF power to said workpiece at a power density in excess of 5 Watts/sq. cm.

12. The method of claim 1 wherein said chucking voltage is set to a point at which a desired temperature of said workpiece is attained.

13. The method of claim 1 wherein the step of controlling said chucking voltage comprises providing a greater chucking voltage for a greater rate of heat dissipation in said workpiece.

14. The method of claim 1 wherein said chucking voltage is sufficient to attain a heat transfer coefficient between the contacting surfaces of the workpiece and puck in excess of about 1000 Watts/m$^{2\circ}$ K.

15. The method of claim 1 wherein the step of providing a polished generally continuous surface comprises polishing a top surface of the puck to an optical mirror-like finish surface finish.

16. The method of claim 15 wherein the step of polishing comprises polishing said surface to a surface finish on the order of several micro-inches RMS deviation or less.

17. The method of claim 1 wherein the step of providing a polished surface comprises machining said surface flat over at least 30% of the cross-sectional area of said puck.

18. The method of claim 1 wherein the step of providing a polished surface comprises machining said surface flat over at least 60% of the cross-sectional area of said puck.

19. The method of claim 1 wherein the step of providing a polished surface comprises machining said surface flat over at least 90% of the cross-sectional area of said puck.

20. The method of claim 1 further comprising providing a non-uniform radial distribution of heat transfer rate between the contacting surfaces of the wafer and the puck.

21. The method of claim 20 wherein said non-uniform radial distribution is center-high.

22. The method of claim 20 wherein said non-uniform radial distribution is center-low.

23. The method of claim 20 wherein the step of providing a non-uniform radial distribution of heat transfer rate comprises:
providing a top surface on the puck that is curved.

24. The method of claim 20 further comprising:
coupling RF power to the wafer during plasma processing with a radially non-uniform distribution of RF-induced heat dissipation in the wafer; and
wherein the step of providing a non-uniform radial distribution of heat transfer rate comprises compensating for the radially non-uniform distribution of RF-induced heat dissipation in the wafer.

25. A method of processing a workpiece in a plasma reactor, comprising:
providing a polished surface on a puck in the reactor;
placing the workpiece over the polished surface of the puck;
cooling the puck;
heating said workpiece by coupling RF power to plasma in said reactor;
introducing a process gas into said reactor;
applying a chucking voltage to a chucking electrode of the puck to pull the workpiece into direct contact with a top surface of the puck with sufficient electrostatic force to remove heat from the workpiece through directly contacting surfaces of the puck and workpiece at about the rate at which heat is deposited in the workpiece; and
controlling said chucking voltage so as to minimize a difference between a measured temperature of said workpiece and a target temperature.

26. The method of claim 1 wherein said voltage is sufficient to reduce an effective air gap between the wafer and the polished surface of the puck to less than about 3 microns.

27. A method of processing a workpiece in a plasma reactor, comprising:
providing a polished surface on a puck in the reactor;
placing the workpiece over the polished surface of the puck;
cooling the puck;
heating said workpiece by coupling RF power to plasma in said reactor;
introducing a process gas into said reactor;
applying a chucking voltage to a chucking electrode of the puck to pull the workpiece into direct contact with a top surface of the puck with sufficient electrostatic force to remove heat from the workpiece through directly contacting surfaces of the puck and workpiece at about the rate at which heat is deposited in the workpiece;
providing a non-uniform radial distribution of heat transfer rate between the contacting surfaces of the wafer and the puck;
wherein the step of providing a non-uniform radial distribution of heat transfer rate comprises: providing plural electrodes within the puck at respective radial zones; and applying separate voltages to the respective plural electrodes so as to produce different attractive forces between the wafer and the puck in different ones of the respective radial zones.

28. A method of processing a workpiece in a plasma reactor, comprising:
providing a polished surface on a puck in the reactor;
placing the workpiece over the polished surface of the puck;
cooling the puck;
heating said workpiece by coupling RF power to plasma in said reactor;
introducing a process gas into said reactor;
applying a chucking voltage to a chucking electrode of the puck to pull the workpiece into direct contact with a top surface of the puck with sufficient electrostatic force to remove heat from the workpiece through directly contacting surfaces of the puck and workpiece at about the rate at which heat is deposited in the workpiece;
providing a non-uniform radial distribution of heat transfer rate between the contacting surfaces of the wafer and the puck; and
wherein the step of providing a non-uniform radial distribution of heat transfer rate comprises providing a non-uniform radial distribution of polished surface finish on the surface of the puck.

29. A method of processing a workpiece in a plasma reactor, comprising:
providing a polished surface on a puck in the reactor;
placing the workpiece over the polished surface of the puck;
cooling the puck;
heating said workpiece by coupling RF power to plasma in said reactor;
introducing a process gas into said reactor;
applying a chucking voltage to a chucking electrode of the puck to pull the workpiece into direct contact with a top surface of the puck with sufficient electrostatic force to remove heat from the workpiece through directly contacting surfaces of the puck and workpiece at about the rate at which heat is deposited in the workpiece;
providing a non-uniform radial distribution of heat transfer rate between the contacting surfaces of the wafer and the puck; and
wherein the step of providing a non-uniform radial distribution of heat transfer rate comprises providing a top surface of the puck that is one of (a) convex, (b) concave.

30. A method of processing a workpiece in a plasma reactor, comprising:
providing a polished surface on a puck in the reactor;
placing the workpiece over the polished surface of the puck;
cooling the puck;
heating said workpiece by coupling RF power to plasma in said reactor;
introducing a process gas into said reactor;
applying a chucking voltage to a chucking electrode of the puck to pull the workpiece into direct contact with a top surface of the puck with sufficient electrostatic force to remove heat from the workpiece through directly contacting surfaces of the puck and workpiece at about the rate at which heat is deposited in the workpiece;
prior to the step of placing the wafer on the top surface of the puck, depositing a seasoning layer on the interior surfaces of the reactor so as to form a puck seasoning layer on the polished puck top surface, whereby the top surface of the puck comprises said seasoning layer;
wherein the step of placing the wafer on a top surface of the puck comprises placing the wafer on the puck seasoning layer whereby the wafer directly contacts said seasoning layer;
during the step of applying RF power to the reactor, introducing a process gas into the reactor and carrying out plasma processing of the wafer;
removing the wafer from the reactor upon completion of the plasma processing; and
removing said seasoning layer from the interior surfaces of the reactor.

31. The method of claim 30 wherein the step of removing the seasoning layer comprises introducing into said reactor an etchant species.

32. The method of claim 31 wherein said seasoning layer comprises one of silicon dioxide, germanium dioxide, silicon nitride, germanium nitride, silicon carbide, aluminum nitride, aluminum oxide, a fluorocarbon polymer, a fluoro-hydrocarbon polymer, a nitride of a silicon hydride, a hydrocarbon, hydride of silicon, hydride of germanium.

33. The method of claim 31 wherein said etchant species comprises one of NF3, F, O, H.

34. The method of claim 31 wherein the step of introducing an etchant species into the reactor comprises generating in a seasoning removal plasma one of: (a) a radicals, (b) reactive ions.

35. The method of claim 34 wherein the seasoning removal plasma is formed in said reactor.

36. The method of claim 34 wherein the seasoning removal plasma is formed in an external source.

* * * * *